(12) United States Patent
Tung et al.

(10) Patent No.: US 12,075,609 B2
(45) Date of Patent: Aug. 27, 2024

(54) CONTACT STRUCTURE, CONTACT PAD LAYOUT AND STRUCTURE, MASK COMBINATION AND MANUFACTURING METHOD THEREOF

(71) Applicant: Fujian Jinhua Integrated Circuit Co., Ltd., Quanzhou (CN)

(72) Inventors: Yu-Cheng Tung, Quanzhou (CN); Yi-Wang Jhan, Quanzhou (CN); Yung-Tai Huang, Quanzhou (CN); Xiaopei Fang, Quanzhou (CN); Shaoyi Wu, Quanzhou (CN); Yi-Lei Tseng, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 288 days.

(21) Appl. No.: 17/320,244

(22) Filed: May 14, 2021

(65) Prior Publication Data
US 2021/0272961 A1 Sep. 2, 2021

Related U.S. Application Data

(63) Continuation of application No. PCT/CN2020/079580, filed on Mar. 17, 2020.

(30) Foreign Application Priority Data

Sep. 27, 2019 (CN) .......................... 201910926986.8
Sep. 27, 2019 (CN) .......................... 201910926990.4

(51) Int. Cl.
*H10B 12/00* (2023.01)

(52) U.S. Cl.
CPC ....... *H10B 12/0335* (2023.02); *H10B 12/053* (2023.02); *H10B 12/09* (2023.02);
(Continued)

(58) Field of Classification Search
None
See application file for complete search history.

(56) References Cited

U.S. PATENT DOCUMENTS 6,756,262 B1 * 6/2004 Nakamura .............. H01L 28/75
257/E21.018
8,901,645 B2 12/2014 Cho
(Continued)

*Primary Examiner* — Steven M Christopher
(74) *Attorney, Agent, or Firm* — Winston Hsu

(57) ABSTRACT

A contact structure, contact pad layout and structure, mask combination and manufacturing method thereof is provided in the present invention. Through the connection of tops of at least two contact plugs in the boundary of core region, an integrated contact with larger cross-sectional area is formed in the boundary of core region. Accordingly, the process of forming electronic components on the contact structure in the boundary of core region may be provided with sufficient process window to increase the size of electronic components in the boundary, lower contact resistance, and the electronic component with increased size in the boundary buffer the density difference of circuit patterns between the core region and the peripheral region, thereby improving optical proximity effect and ensuring the uniformity of electronic components on the contact plugs inside the boundary of core region, and avoiding the collapse of electronic components on the contact plug in the boundary.

6 Claims, 22 Drawing Sheets

(52) U.S. Cl.
CPC ........... *H10B 12/315* (2023.02); *H10B 12/34* (2023.02); *H10B 12/482* (2023.02); *H10B 12/485* (2023.02); *H10B 12/50* (2023.02)

(56) References Cited

U.S. PATENT DOCUMENTS

| | | |
|---|---|---|
| 8,928,092 B2 | 1/2015 | Han |
| 9,508,732 B2 | 11/2016 | Lee |
| 9,966,377 B2 | 5/2018 | Cantoro |
| 9,972,544 B2 | 5/2018 | Kim |
| 10,128,154 B2 | 11/2018 | Jeong |
| 2006/0237783 A1 | 10/2006 | Eun |

* cited by examiner

CONTACT STRUCTURE, CONTACT PAD LAYOUT AND STRUCTURE, MASK COMBINATION AND MANUFACTURING METHOD THEREOF

CROSS REFERENCE TO RELATED APPLICATIONS

This application is a continuation of PCT Application No. PCT/CN2020/079580 filed on Mar. 17, 2020, the entire contents of which are incorporated herein by reference.

BACKGROUND OF THE INVENTION

1. Field of the Invention

The present invention relates generally to a semiconductor technology, more specifically, to a contact structure and the manufacturing method thereof, contact pad layout, contact pad, mask combination, semiconductor device and manufacturing method thereof.

2. Description of the Prior Art

Various technologies have been used to integrated more circuit patterns in a limited area of semiconductor substrate or chip. Since circuit patterns have different spacings, integrated circuits are generally divided into device dense regions (Dense), device loose regions (ISO) and device isolated region. Device dense region is a region with higher device density (i.e. devices are closely-spaced), device loose region is a region with lower device density (i.e. devices are loosely-spaced), and device isolated region is a region relative to the loose region and the dense region. With continuous decrease of critical dimension of semiconductor device, the density of circuit patterns and/or device height are also continuously increased. It would become more difficult to perform a photolithography process and/or an etching process (ex. decreased process window) due to the resolution limits of optical exposure tool and the loading effect (i.e. the dense/isolated loading effect of circuit patterns) caused by the density difference between device dense regions and device isolated regions, thereby impacting the performance of resultant semiconductor devices.

For example, in the case of dynamic random access memory (referred hereinafter as DRAM), a great number of memory cells are gathered to form a memory array. Peripheral regions are provided aside the memory array, including other transistors and contacts. The memory array serves as a device dense region of DRAM for storing data, while the peripheral region serves as a device loose region for providing I/O signals required by the memory array, wherein each memory cell may be constituted by a metal oxide semiconductor (MOS) transistor and a capacitor connected in series. The capacitor is formed in the memory array, stacked on a bit line and electrically coupled to a corresponding storage node contact. The storage node contact is further electrically coupled to an underlying active area. With continuous development of semiconductor technology, the critical dimension of semiconductor device is also decreased continuously, and the spacings between memory cells of DRAM get smaller and smaller. In the case that using self-aligned contact (SAC) process to form storage node contacts, the contact holes formed in the memory array are inconsistent and the contact holes formed in the boundary of device dense region are abnormal due to the resolution limits of optical exposure tool and the loading effect (i.e. the dense/isolated loading effect of circuit patterns) caused by the density difference between device dense regions and device isolated regions. It may result in decreased contact area between the contact plugs in the contact holes and the capacitors formed thereon and increased contact resistance. Some memory cells may fail due to open circuit or short circuit of the contact plugs, and the collapse of capacitors may occur in the boundary of memory array. These issues would impact and limit the performance of DRAM.

SUMMARY OF THE INVENTION

The purpose of present invention is to provide a contact structure and the manufacturing method thereof, contact pad layout, contact pad, mask combination, semiconductor device and the manufacturing method thereof, to solve the issue s of inconformity of the electronic structures connected on contact pads inside the core region and structural anomaly of the electronic structures connected on contact pads in the boundary of core region.

To solve aforementioned technical issues, the present invention provides a contact pad structure, including:
multiple contact plugs formed on core components in the core region of semiconductor device, and bottoms of the contact plugs contact active areas of the corresponding core components;
wherein tops of at least two contact plugs formed in the boundary of the core region are connected together, and all contact plugs with connecting tops include the outermost contact plugs in the boundary.

Base on the same invention concept, the present invention further provides a semiconductor device, including:
a semiconductor substrate with a core region, multiple core components are formed in the core region;
an interlayer dielectric layer covering on the semiconductor substrate; and
the contact structure of semiconductor device as described in the present invention, the contact structure is formed in the interlayer dielectric layer, bottoms of contact plugs of the contact structure contact the active areas of corresponding core components, and tops of at least two contact plug formed in the boundary of core region in the contact structure are connected together, and all of the contact plugs with the connecting tops include the outermost contact plug in the boundary.

Based on the same invention concept, the present invention further provides a method of manufacturing a contact structure of semiconductor device, including:
providing a semiconductor substrate with a core region, multiple core components are formed in the core region;
forming an interlayer dielectric layer on the semiconductor substrate and forming multiple contact holes in the interlayer dielectric layer, the contact holes passes through the interlayer dielectric layer and expose the active areas of corresponding core components;
forming contact plugs in the contact holes, the bottom of contact plug contacts the active area of corresponding core component, and tops of at least two contact plugs formed in the boundary of core region are connected together, and all of the contact plug with the connecting tops include outermost contact plugs in the boundary.

Based on the same invention concept, the present invention further provides a method of manufacturing a semiconductor device, including forming a contact structure electrically contacted on corresponding core component on a semiconductor substrate with a core region by using the method of manufacturing the contact structure of semiconductor device described in the present invention.

In comparison to conventional skills, the technical proposal of present invention has following advantages:

Through the connection of tops of at least two contact plugs in the boundary of core region, an integrated contact with larger cross-sectional area is formed in the boundary of core region. Accordingly, for one thing, the process of forming electronic structures (ex. the bottom plate of capacitors in DRAM) on the integrated contact in the boundary of core region may be provided with sufficient process window to facilitate the size increasing of the electronic components in the boundary, avoiding the anomaly or collapse of electronic components in the boundary, for another thing, providing larger contact area between the electronic component and the integrated contact below in the boundary to decrease contact resistance and improve electrical performance of the device. More importantly, the size of electronic component in the boundary is increased to buffer the density difference of circuit patterns between the core region and the peripheral region, thereby improving optical proximity effect when performing photolithography processes and/or etching process and mitigating loading effect in dense/isolated regions to ensure the uniformity of electronic components on the contact plugs inside the boundary of core region.

The present invention further provides a contact pad layout of semiconductor device, comprising, including:
- a primary layout region, the primary layout region is provided with multiple primary contact pad patterns, shapes and sizes of the primary contact pad patterns are similar, all of the primary contact pad patterns are in checkerboard arrangement, and a fourth spacing is between the primary contact pad patterns; and
- a first edge layout region outside one edge of the primary layout region, the primary layout region is provided with at least one first edge contact pad pattern, an area of each of the first edge contact pad pattern is larger than an area of each of the primary contact pad patterns, and a first edge spacing is between the first edge layout region and the primary layout region;
- wherein the first edge contact pad pattern is different from the primary contact pad pattern, and the first edge spacing is different from the fourth spacing.

Based on the same invention concept, the present invention further provide a contact pad structure formed by using the contact pad layout of semiconductor device described in the present invention, including:
- multiple primary contact pads in a checkerboard arrangement, shapes and sizes of the primary contact pads are similar, and a fourth spacing is between the primary contact pads; and
- at least one first edge contact pad outside one edge of a region of the primary contact pads, a top area of each of the first edge contact pad is larger than a top area of each of the primary contact pads, and a first edge spacing is between the first edge contact pad closest to the primary contact pad and the adjacent primary contact pad;
- wherein a size of the first edge contact pad is different from a size of the primary contact pad, and the first edge spacing is different form the fourth spacing.

Based on the same invention concept, the present invention further provides a semiconductor device, including:
- a semiconductor substrate with a core region, multiple core components formed in the core region;
- an interlayer dielectric layer covering on the semiconductor substrate;
- the contact pad structure of semiconductor device as described in the present invention, formed in the interlayer dielectric layer;
- multiple contact plugs formed in the interlayer dielectric layer, the contact plugs are aligned with corresponding contact pads in the contact pad structure to electrically connect the corresponding contact pads with the active areas of the core components, and the contact pads comprises primary contact pads or first edge contact pads.

Based on the same invention concept, the present invention further provides a mask combination for manufacturing the contact pad structure of semiconductor device as described in the present invention, including:
- a first mask with multiple parallel first lines, a first spacing is between two of the adjacent first lines, a width of at least one of the outermost first lines of the first mask is larger than widths of the other first lines, and a width of at least one of the outermost first spacing of the first mask is larger than a width of the other first spacings; and
- a second mask with multiple parallel second lines intersecting the first lines, a second spacing is between two of the adjacent second lines, a width of at least one of the outermost second lines of the second mask is larger than widths of the other second lines, and a width of at least one of the outermost second spacing of the second mask is larger than a width of the other second spacings;
- wherein in the case that the first mask and the second mask are homogeneous mask and the second mask is aligned and overlapped with the first mask, overlapping regions of the first lines and the second lines are regions for forming contact pads, in the case that the first mask and the second mask are heterogeneous mask and the second mask is aligned and overlapped with the first mask, overlapping regions of the first lines and the second spacings are regions for forming contact pads.

In comparison to conventional skills, the technical proposal of present invention has following advantages:

Through the arrangement of a first edge layout region at one side of the primary layout region where the primary contact pad patterns formed and the area of each first edge contact pad pattern in the first edge layout region larger than the area of each primary contact pad pattern, accordingly, in the case that the primary contact pads in the core region are formed based on the contact pad layout, the first edge contact pad patterns may be used to form corresponding dummy contact pads in the boundary of core region or in the border region between the core region and the peripheral region and to make the top area of dummy contact pad larger than the top area of primary contact pad. Accordingly, the size of electronic structure connected later on the dummy contact pad may be increased, to improve the dense/isolated loading effect of the circuit pattern between the core region and the peripheral region when connecting the electronic structures on the primary contact pads and dummy contact pads, thereby improving the uniformity of electronic structures connected on the primary contact pads in the core region, as well as avoiding structural anomaly of the electronic structures connected on the primary contact pads in the boundary of core region and improving the performance of resultant semiconductor devices.

These and other objectives of the present invention will no doubt become obvious to those of ordinary skill in the art after reading the following detailed description of the preferred embodiment that is illustrated in the various figures and drawings.

DETAILED DESCRIPTION

The technical scheme provided by the present invention will be further described in detail below with reference to the drawings and specific embodiments. The advantages and features of present invention will become obvious to those of ordinary skill in the art according to the following description. It should be noted that all figures are diagrammatic in a quite simplified form and are not drawn to scale for the sake of clarity and convenience to describe the embodiments of present invention.

Figure 1A:
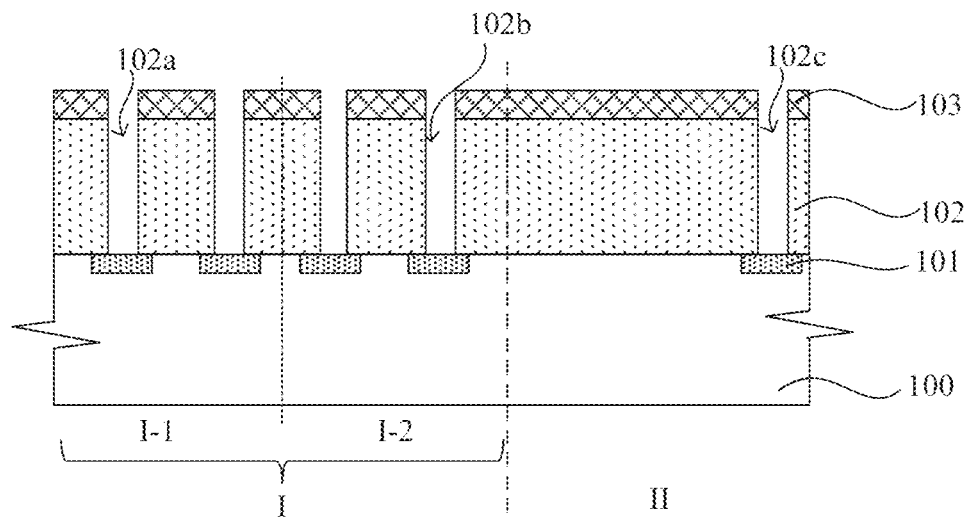
FIGS. 1A-1D are schematic cross-sections in the method of manufacturing a contact structure of semiconductor device in an embodiment of the present invention.
Figure 1B:
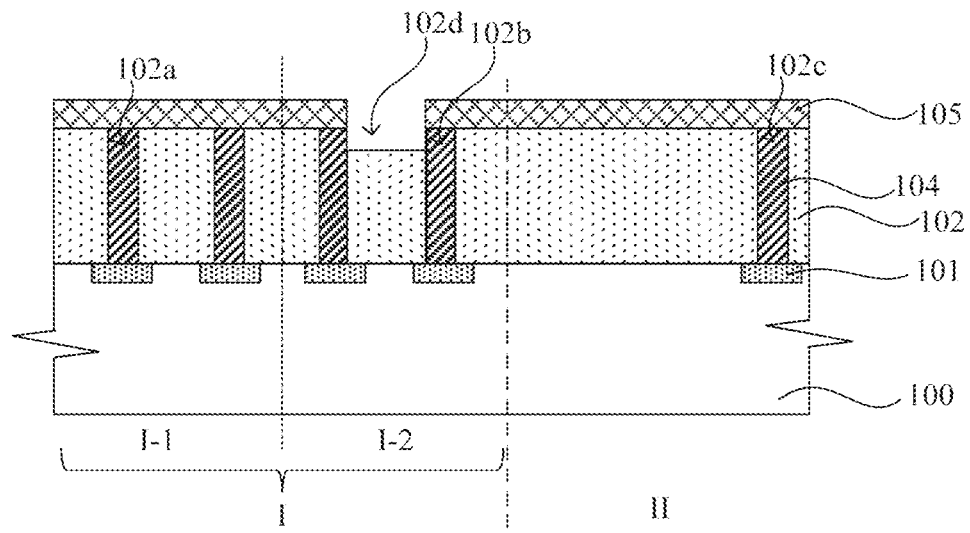
Figure 1C:
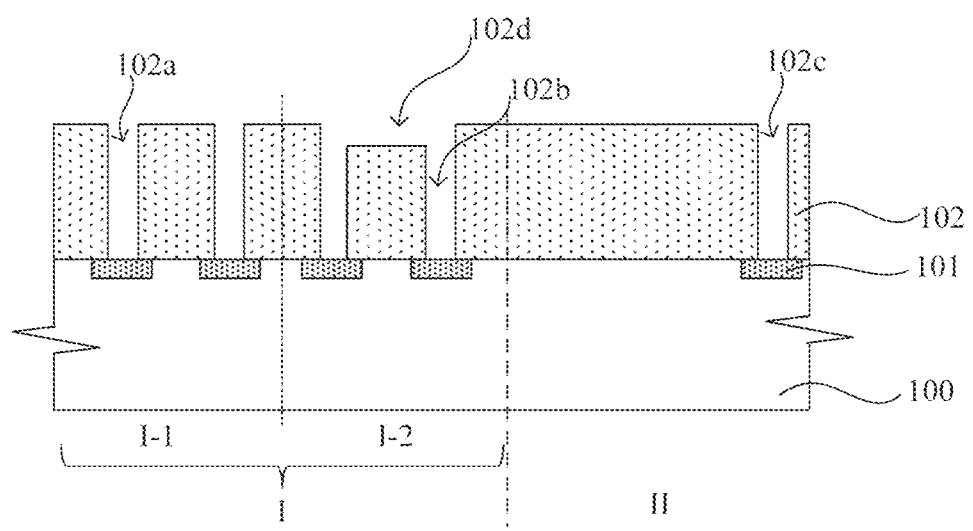
Figure 1D:
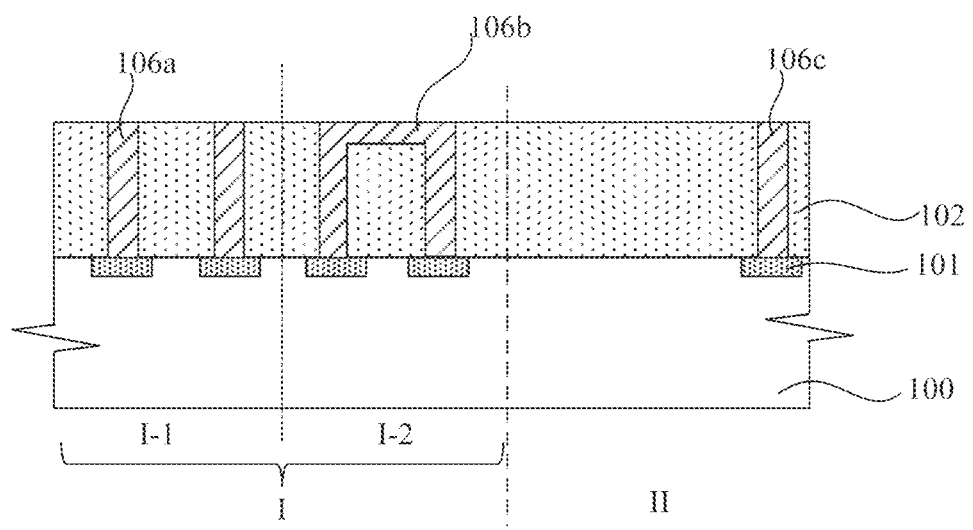

FIG. 1D is a schematic cross-section of a contact structure of semiconductor device in an embodiment of present invention. Please refer to FIG. 1D. The contact structure of semiconductor device provided in an embodiment of present invention includes multiple contact plugs 106a, 106b, wherein the contact plugs 106a, 106b are formed on core components (not shown) in a core region I of the semiconductor device, and the bottoms of contact plugs 106a, 106b contact active areas 101 of corresponding core components. The core region I includes a boundary (or referred as edge region, border region, interface region) I-2 and a central region I-1 inside the boundary I-2. The tops of at least two contact plugs 106b in the boundary I-2 of core region I are connected together. The core region I is a device dense region, and surrounding peripheral region II is device isolated region.

Each contact plug 106a, 106b, 106c may include metal barrier layers (not shown) and metal layers (not shown). The metal barrier layer may include, for example, Ti, Ta, Mo, $Ti_xN_y$, $Ta_xN_y$, $Ti_xZr_y$, $Ti_xZr_yN_z$, $Nb_xN_y$, $Zr_xN_y$, $W_xN_y$, $V_xN_y$, $Hf_xN_y$, $Mo_xN_y$, $Ru_xN_y$, and/or $Ti_xSi_yN_z$. The metal layer may include, for example, W, Cu and/or Al.

All contact plugs 106b with connecting tops in the boundary I-2 of core region I form an inverted-U contact or a comb contact. That is, all contact plugs 106b with connecting tops in the boundary I-2 of core region I form an integrated contact with larger top cross-sectional area in the boundary I-2.

Figure 12:
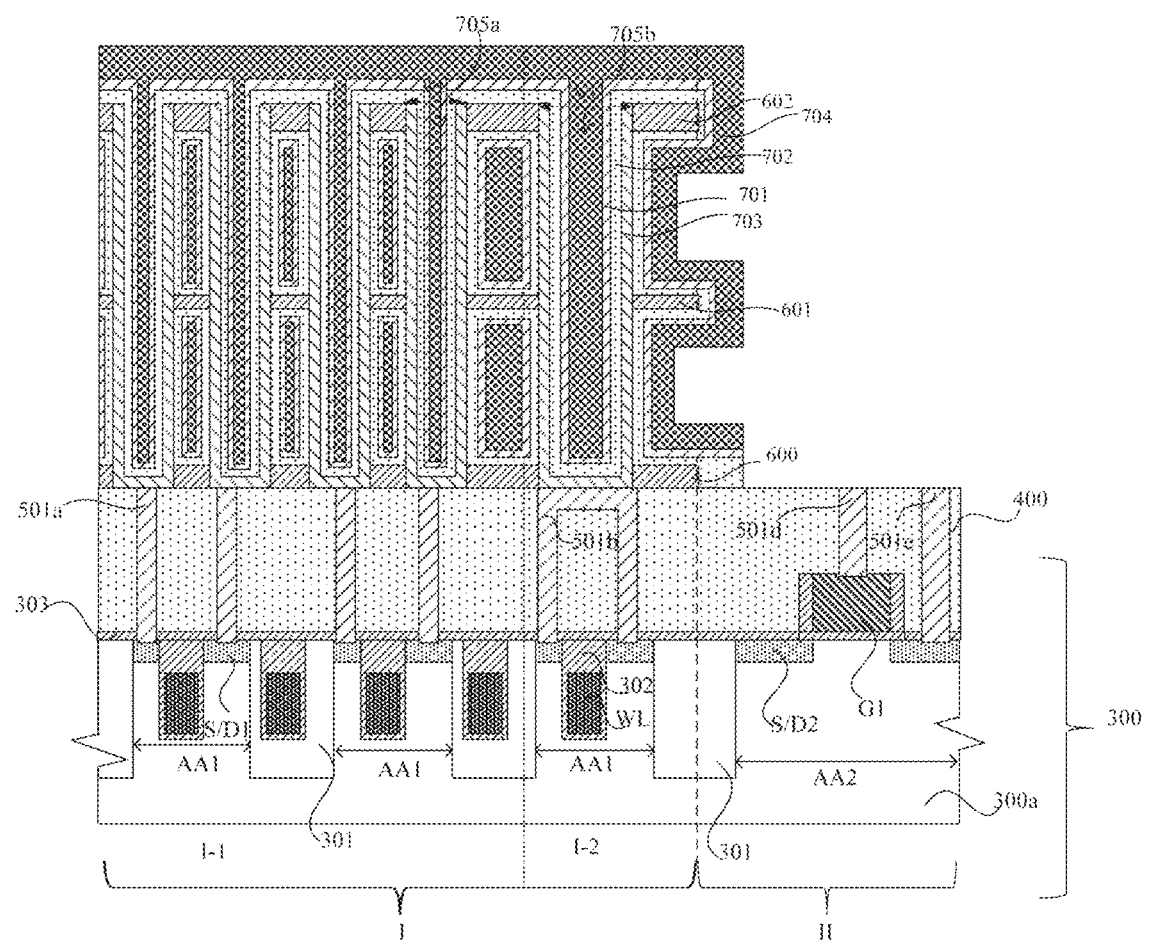

Please refer to FIG. 1D and FIG. 12 collectively. In the embodiment, the semiconductor device is a dynamic random access memory (DRAM). The core region is a memory array region of the DRAM, the core component is a storage transistor, and the contact structure is a storage node contact connecting a capacitor (i.e. storage node) above. That is, each contact plug 106a in the central region I-1 of core region I connects a capacitor above (as 705a shown in FIG. 12), and the capacitor in the boundary I-2 has a first width W1, while the capacitor inside the boundary I-2 of core region I (i.e. the central region I-1) has a second width W2. Since the presence of integrated contact with larger top cross-sectional area formed in the boundary I-2 of core region I, the process of forming capacitor in the boundary I-2 may be provided with sufficient process window to facilitate the increasing of first width W1 of the capacitor in the boundary I-2, so that the first width W1 may be larger than the second width W2, and in turn, for one thing, avoiding the collapse of capacitors formed in the boundary I-2, for another thing, providing larger contact area between the capacitor in the boundary I-2 and the integrated contact below to decrease contact resistance and improve electrical performance of the device. More importantly, the size of capacitor in the boundary I-2 is increased to buffer the density difference of circuit patterns between the core region I and the peripheral region II, thereby improving optical proximity effect when performing photolithography processes and/or etching process and mitigating loading effect in dense/isolated regions to ensure the uniformity of capacitors on the contact plugs 106a inside the boundary I-2 of the core region I (i.e. the central region I-1), thereby avoiding structural anomaly of capacitor on the contact plug in some position of the core region I or the collapse of capacitor on the contact plug in the boundary I-2. Optionally, the first width W1 is larger than a half of the second width W2.

Figure 3:
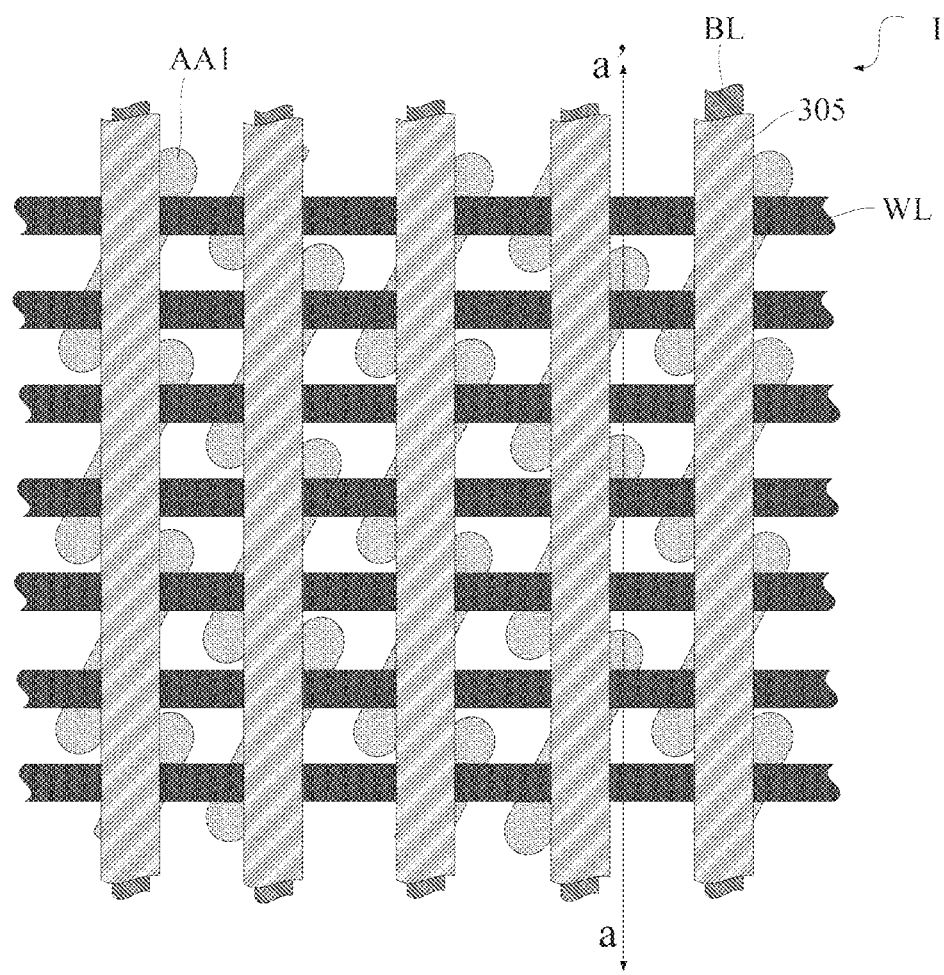
FIG. 3 is a schematic plan view in the method of manufacturing a semiconductor device in an embodiment of the present invention.

Please refer to FIG. 3 and FIG. 12. The semiconductor device includes multiple word lines WL and multiple bit lines BL. Each of the word lines WL intersects with the multiple active areas AA1 in the core region I. The word line WL may be buried word line. Bit lines BL are formed on the core components in the core region I and are perpendicular to word lines WL. The structure formed by contact plugs with connecting tops (ex. the inverted-U contact or comb contact) crosses over at least one word line WL and aligns with bit lines BL (ex. in parallel). For example, the integrated inverted-U contact or comb contact crosses over one word line WL in an active area AA1 on the outermost boundary of the core region I (i.e. the side of boundary I-2 close to the peripheral region II, that is, the outermost side of boundary I-2). Please note that in the embodiment, although the exemplified semiconductor device is DRAM, the technical proposal of present invention is not limited thereto. The semiconductor device may be any suitable electronic device, such as memories in other architectures. In this case, the capacitor may be replaced with corresponding electronic structure, such as resistor.

FIGS. 1A-1D are schematic device cross-sections illustrating the method of manufacturing the contact structure of semiconductor device in accordance with the embodiments. Please refer to FIGS. 1A-1D. The embodiment further provides a method of manufacturing the contact structure of semiconductor device, including following steps:

Firstly, please refer to FIG. 1A. Provide a semiconductor substrate 100 with a core region I and a peripheral region II. The semiconductor substrate 100 may be selected from silicon substrate, silicon-on-insulator (SOI), germanium substrate, germanium-on-insulator (GOI), silicon-germanium substrate. Multiple shallow trench isolations (not shown) are formed in the semiconductor substrate 100. The shallow trench isolations are formed by etching the semiconductor substrate 100 to form trenches and then filling up the trenches with isolation material. The material of shallow trench isolations may include silicon oxide, silicon nitride or silicon oxynitride, etc. The shallow trench isolations demarcate the border of core region I and peripheral region II (i.e. demarcating the boundary I-2 of core region I) on a two-dimensional plane. At the same time, the active areas 101 corresponding to core components in the core region I and peripheral components in the peripheral region II are also demarcated.

Then, please refer still to FIG. 1A. An interlayer dielectric layer 102 is covered on the semiconductor substrate 100. The interlayer dielectric layer 102 may be formed of monolayer structure or multilayer structure. The interlayer dielectric layer 102 may include at least one material selected from silicon nitride, silicon oxynitirde and low-k dielectrics, wherein the dielectric constant k of low-k dielectrics is smaller than the dielectric constant of silicon oxide and may be used as an inter-metal dielectric (IMD) layer. It may be, for example, high density plasma (HDP) oxide, tetraethyl orthosilicate (TEOS), plasma-enhanced TEOS (PE-TEOS), undoped silicate glass (USG), phosphosilicate glass (PSG), borosilicate Glass (BSG), borophosphosilicate glass (BPSG), fluorosilicate Glass (FSG), spin-on glass (SOG), etc. In addition, an etch stop layer (not shown) may be formed between the semiconductor substrate 100 and the interlayer dielectric layer 102. The etch stop layer may include SiN, SiON, SiC, SiCN, BN (boron nitride) or any combination thereof. The etch stop layer and the interlayer dielectric layer 102 may be formed by using plasma-enhanced CVD (PECVD), high density plasma CVD (HDP-CVD), atmospheric pressure CVD (APCVD) and/or spin coating process.

Thereafter, please refer still to FIG. 1A. Form a first mask pattern 103 on the interlayer dielectric layer 102 through a first photolithography process. The first mask pattern 103 demarcates the positions of contact plugs. The interlayer dielectric layer 102 is then anisotropically etched by using the first mask pattern 103 as an etch mask to form contact holes 102a, 102b and 102c exposing corresponding active areas below through the interlayer dielectric layer 102. The contact holes 102a, 102b and 102c are individual, wherein each contact hole 102a is in the central region I-1 of core region I and exposes the active area 101 of corresponding core component in the central region I-1, each contact hole 102b is in the boundary I-2 of core region I and exposes the active area 101 of corresponding core component in the boundary I-2, and each contact hole 102c is in the peripheral region II and exposes the active area 101 of corresponding peripheral component.

Afterward, please refer to FIG. 1B. After the contact holes 102a-102c are formed, an ashing process or wet clean process may be performed to remove the first mask pattern 103 and a sacrificial layer 104 is filled in the contact holes 102a-102c. The sacrificial layer 104 may be formed by spin-on hardmask (SOH) or amorphous carbon layer (ACL), so that the sacrificial layer 104 may be used to fill the contact holes 102a-102c having higher aspect ratio.

Thereafter, please refer still to FIG. 1B. Form a second mask pattern 105 on the interlayer dielectric layer 102 and the sacrificial layer 104 through a second photolithography process. The second mask pattern 105 demarcates the recesses 102d that will be used to connect the tops of at least two corresponding contact holes 102b in the boundary I-2. The interlayer dielectric layer in the boundary I-2 is etched by using the second mask pattern 105 as a mask to form the recess 102d connecting the tops of at least two corresponding contact holes 102b in the boundary. The recess 102d exposes at least one outermost contact hole in the boundary I-2 (for example, the recess 102d exposes at least one contact hole in an outermost row of contact holes in the boundary I-2).

Please refer to FIG. 1C. The sacrificial layer 104 and the second mask pattern 105 in the contact holes 102a-102c, 102d may be removed by using an ashing process with oxygen, ozone or UV or by using a wet clean process, to re-expose the contact holes 102a-102c and the recess 102d.

Please refer to FIG. 1D. A metal barrier layer (not shown) may be formed in the contact holes 102a-102c and the recess 102d. For example, the metal barrier layer may cover inner sidewalls of the contact holes and the recess and the top surface of interlayer dielectric layer 102 in an uniform thickness. The metal barrier layer may reduce or prevent the diffusion of metal materials in the contact holes and the recesses into the interlayer dielectric layer 102. For example, the metal barrier layer may be formed of Ta, TaN, TaSiN, Ti, TiN, TiSiN, W, WN or any combination thereof by using chemical vapor deposition (CVD), atomic layer deposition (ALD) or physical vapor deposition (PVD, ex. sputter). Then, fill a metal layer in the contact holes 102a-102c and the recess 102d to form contact plugs 106a, 106c and integrated contact 106b, wherein the metal layer may be formed of (one or more) refractory metal (ex. Co, Fe, Ni, W and/or Mo), wherein the metal layer may be formed by a deposition process with good step coverage, for example, by using chemical vapor deposition (CVD), atomic layer deposition (ALD) or physical vapor deposition (PVD, ex. sputter). The metal layer formed by deposition further covers on the surface of interlayer dielectric layer 102 surrounding the contact holes. Thereafter, a chemical mechanical polishing (CMP) process may be used to chemically and mechanically polish the top surface of deposited metal layer until the top surface of interlayer dielectric layer 102 exposed, thereby forming the contact plugs 106a, 106c and the integrated contact 106b in the interlayer dielectric layer 102.

The method shown in FIGS. 1A-1D may reduce the frequency of deposition processes to integrally form all contact plug 106 with connecting tops while maintaining the frequency of photolithography processes.

Figure 2A:
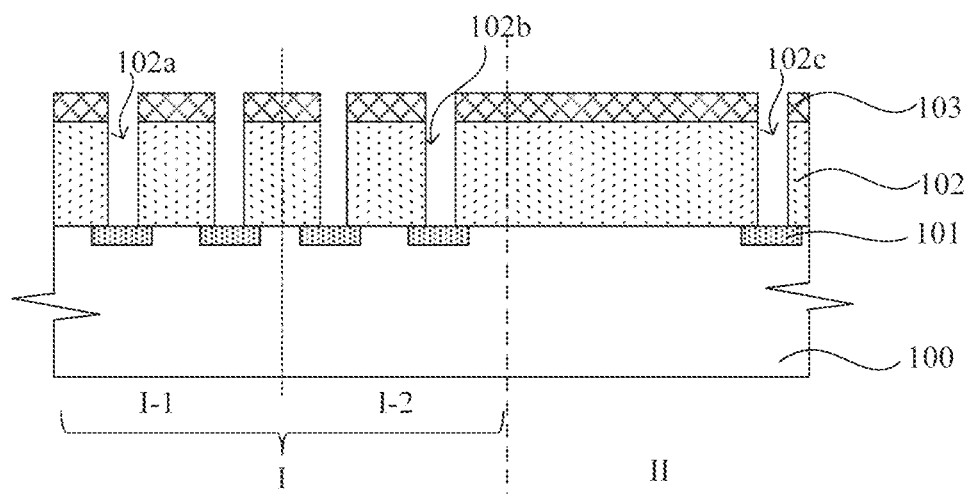
FIGS. 2A-2D are schematic cross-sections in the method of manufacturing a contact structure of semiconductor device in another embodiment of the present invention.
Figure 2B:
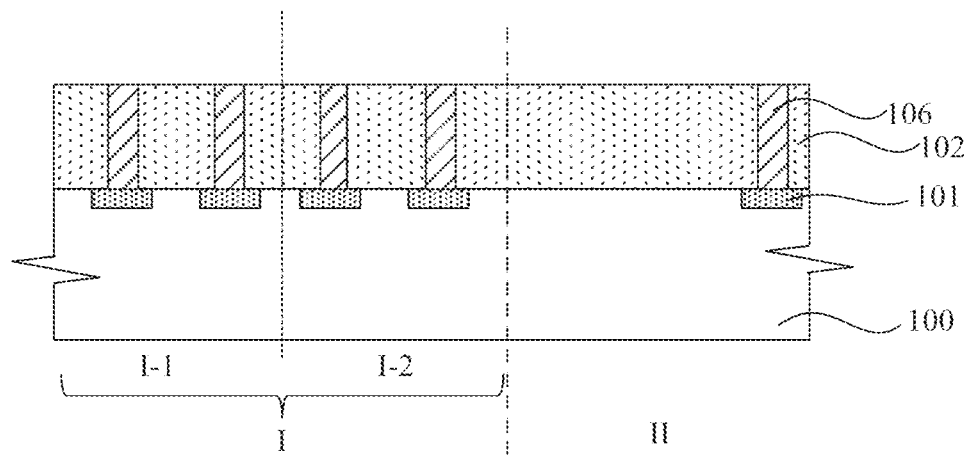
Figure 2C:
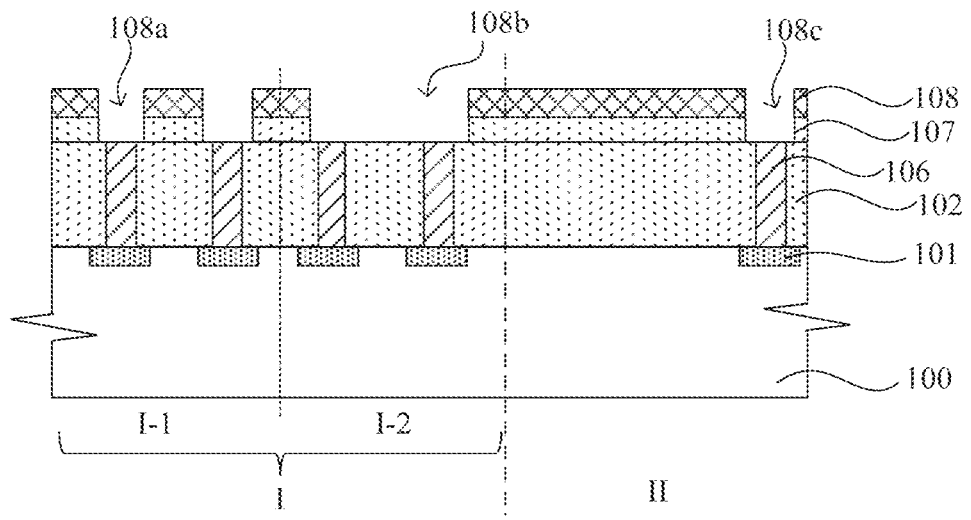
Figure 2D:
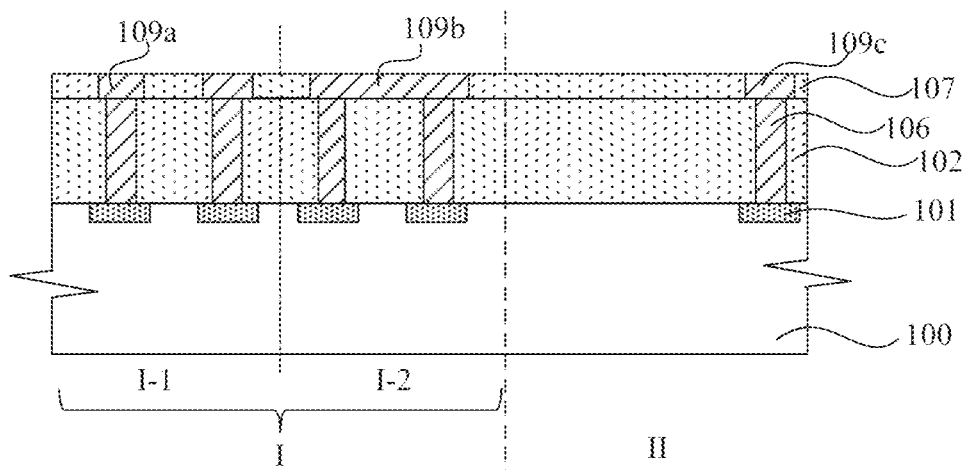

Please refer to FIG. 2D. Another embodiment of the present invention provides a contact structure of semiconductor device having multiple contact plugs 106, wherein the tops of at least two contact plugs 106 in the boundary (or referred as edge region, border region, interface region) I-2 of core region I of semiconductor device are connected together through a contact pad 109b with larger area. The core region I is device dense region, and surrounding peripheral region II is device isolated region. Individual contact pads 109a is disposed on the tops of contact plugs 106 inside the boundary I-2 of core region I (referred as central region I-1), and each contact pads 109a electrically contacts the top of corresponding contact plug 106.

All contact plugs 106 with connecting tops through corresponding contact pad 109b in the boundary I-2 of core region I form an inverted-U contact or a comb contact. That is, all contact plugs 106 with connecting tops in the boundary I-2 of core region I form an integrated contact with larger top cross-sectional area in the boundary I-2.

Please refer to FIG. 2D and FIG. 12 collectively. In another embodiment of the present invention, the semiconductor device is dynamic random access memory (DRAM). The core region is a memory array region of the DRAM, the core component is a storage transistor, and the contact structure is a storage node contact connecting a capacitor above. That is, each contact plug in the central region I-1 of core region I connects a capacitor above (as 705a shown in FIG. 12), one integrated contact in the boundary I-2 of core region I connects a capacitor above (as 705b shown in FIG. 12), and the capacitor in the boundary I-2 has a first width W1, while the capacitor inside the boundary I-2 of core region I (i.e. the central region I-1) has a second width W2. Since the presence of integrated contact with larger top cross-sectional area in the boundary I-2 of core region I, the process of forming capacitor in the boundary may be provided with sufficient process window to facilitate the increasing of first width W1 of the capacitor in the boundary I-2, so that the first width W1 is larger than the second width W2, and in turn, for one thing, avoiding the collapse of capacitors formed in the boundary, for another thing, providing larger contact area between the capacitor and the integrated contact below in the boundary to decrease contact resistance and improve electrical performance of the device. More importantly, the size of capacitor in the boundary is increased to buffer the density difference of circuit patterns between the core region I and the peripheral region II, thereby improving optical proximity effect when performing photolithography processes and/or etching process and mitigating loading effect in dense/isolated regions. It also ensures the uniformity of capacitors on the contact plugs 106a inside the boundary I-2 of core region I (i.e. the central region I-1), thereby avoiding structural anomaly of the capacitor on the contact plug in some positions of the core region I or the collapse of capacitors on the contact plugs in the boundary I-2. Optionally, the first width W1 is larger than a half of the second width W2.

FIGS. 2A-2D are schematic device cross-sections illustrating the method of manufacturing the contact structure of semiconductor device in accordance with another embodiment of the present invention. Please refer to FIGS. 2A-2D. The embodiment further provides a method of manufacturing the contact structure of semiconductor device, including following steps:

Firstly, please refer to FIG. 2A. Provide a semiconductor substrate 100 with a core region I and a peripheral region II. Multiple shallow trench isolations (not shown) are formed in the semiconductor substrate 100. The shallow trench isolations demarcate the border of core region I and peripheral region II (i.e. demarcating the boundary I-2 of core region I) on a two-dimensional plane. At the same time, the active areas 101 corresponding to the core components in core region I and the peripheral components in peripheral region II are also demarcated.

Then, please refer still to FIG. 2A. A first interlayer dielectric layer 102 is covered on the semiconductor substrate 100. In addition, an etch stop layer (not shown) may be formed between the semiconductor substrate 100 and the first interlayer dielectric layer 102. Form a first mask pattern 103 on the first interlayer dielectric layer 102 through a first photolithography process. The first mask pattern 103 demarcates the positions of contact plugs. The first interlayer dielectric layer 102 is then anisotropically etched by using the first mask pattern 103 as an etch mask to form contact holes 102a, 102b and 102c exposing corresponding active areas 101 below through the interlayer dielectric layer 102. Each contact hole 102a is in the central region I-1 of core region I and exposes the active area 101 of corresponding core component in the central region I-1, each contact hole 102b is in the boundary I-2 of core region I and exposes the active area 101 of corresponding core component in the boundary I-2, and each contact hole 102c is in the peripheral region II and exposes the active area 101 of corresponding peripheral component.

Please refer then to FIG. 2B. After the contact holes 102a-102c are formed, an ashing process or wet clean process may be performed to remove the first mask pattern 103 and TiN-based metal barrier layer (not shown) and W-based metal layer (not shown) are filled in the contact holes 102a-102c. A chemical mechanical polishing (CMP) process may be further used to chemically and mechanically polish the top surface of deposited metal layers until the top surface of first interlayer dielectric layer 102 exposed, thereby forming the contact plugs 106 in the interlayer dielectric layer 102. The bottom of each contact plugs 106 in the core region I contacts the active area 101 of corresponding core component, while the bottom of each contact plugs 106 in the peripheral region II contacts the active area 101 of corresponding peripheral component.

Please refer to FIG. 2C. A second interlayer dielectric layer 107 and a second mask pattern 108 may be formed on the first interlayer dielectric layer 102 and the contact plugs 106. The second mask pattern 108 may be formed through a second photolithography process to demarcate the recess that will be used to connect the tops of at least two corresponding contact plugs 106 in the boundary I-2. The second interlayer dielectric layer 107 is etched by using the second mask pattern 108 as a mask to form the recess exposing the tops of corresponding contact plugs 106, wherein the corresponding recess 108b in the boundary I-2 exposes at least two contact plugs 106 and the top surface therebetween, and the recesses 108a inside the boundary I-2 of core region I (ex. the central region I-1) expose the tops of corresponding contact plugs 106, while the recess 108b exposes the top of at least one outermost contact plug 106 in the boundary I-2.

Please refer to FIG. 2D. The second mask pattern 105 may be removed by using an ashing process with oxygen, ozone or UV or by using a wet clean process, and a metal barrier layer (not shown) and a metal layer (not shown) are formed sequentially in the recesses 108a-108c. The metal barrier layer may reduce or prevent the diffusion of metal materials in the contact holes and the recesses into the interlayer dielectric layer 102. Then, fill a metal layer in the contact holes 108a-108c to form individual contact plugs 109a, 109b, 109c, wherein the contact pad 109a is formed on the top of contact plug 106 in the central region I-1 of core region I and electrically and respectively connects the top of corresponding contact plug 106, while the contact pad 109b is formed on the top of contact plug 106 in the boundary I-2 of core region I and electrically and respectively connects the top of corresponding contact plug 106, so that all contact plugs 106 with connecting tops in the boundary I-2 form an inverted-U contact or a comb contact.

The method shown in FIGS. 2A-2D may divide the manufacturing process of every contact plug (including contact plugs with connecting tops and individual contact plugs) into two-stage processes in different heights while maintaining the frequency of photolithography processes, so that the aspect ratio of corresponding contact holes or recesses in corresponding etching processes and filling processes in each stage may be reduced to ensure the performance of resultant contact structure.

Please refer to FIG. 1D and FIG. 2D. One embodiment of the present invention further provides a semiconductor device, including a semiconductor substrate 100 with a core region I, multiple core components formed in the core region I, an interlayer dielectric layer 102 covering on the semiconductor substrate 100, and the contact structure of semiconductor device described in the embodiments of present invention. The contact structure is formed in the interlayer dielectric layer 102, the bottom of each contact plug contacts the active area 101 of corresponding core component, and the tops of at least two contact plugs formed in the boundary I-2 of core region are connected together.

Please refer to FIG. 2D and FIG. 12 collectively. The semiconductor device further includes capacitors formed on the interlayer dielectric layer 107 and with bottoms connecting to the contact structure. The capacitor in the boundary I-2 (as 705b shown in FIG. 12) has a first width W1, while the capacitor (as 705a shown in FIG. 12) inside the boundary I-2 of core region I (i.e. the central region I-1) has a second width W2. The first width W1 is larger than the second width W2.

It should be noted that the technical scheme of present invention is not limited merely to the aforementioned method of forming the contact structure. Any method capable of forming individual contacts and contacts with connecting tops is suitable for the technical scheme of present invention. For example, in still another embodiment of the present invention, after the structures of FIG. 1A are formed and the mask pattern 103 is removed, the sacrificial layer will not be filled. Instead, the materials of contact plugs (including metal barrier layer and metal layer) are directly filled to form individual contact plugs. The mask pattern 105 in FIG. 1B is then formed on the interlayer dielectric layer 102 and the individual contact plugs, and the interlayer dielectric layer 102 is further etched to form recess 102d exposing top sidewalls of at least two contact plugs 102b in the boundary I-2. The recess 102d is then filled with conductive material to form a contact pad (not shown) connecting the tops of contact plugs 102b exposed from the recess 102d.

In embodiment below, FIGS. 3-12 are referred to specify a semiconductor device and manufacturing method thereof in one embodiment of the present invention, wherein FIG. 3 is a schematic plan view of a device structure in accordance with the method of manufacturing the semiconductor device in one embodiment of the present invention, while FIGS. 4-12 are schematic cross-sections of the device structure taken along the line a-a' in FIG. 3 in accordance with the method of manufacturing the semiconductor device in one embodiment of the present invention.

Figure 4:
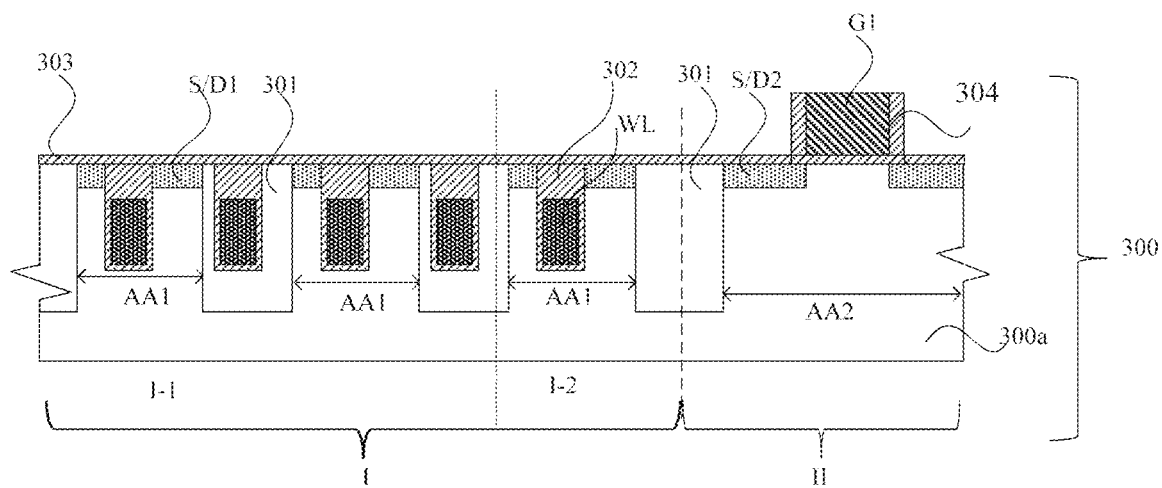
FIGS. 4-12 are schematic cross-sections taken along a section line a-a' in FIG. 3 in the method of manufacturing a contact structure of semiconductor device in an embodiment of the present invention.

Firstly, please refer to FIG. 3 and FIG. 4. Provide a semiconductor substrate 300 with multiple core components (i.e. storage transistors). The explicit procedure includes:

Firstly, please refer to FIG. 3 and FIG. 4. Provide a semiconductor substrate 300a with a core region I and a peripheral region II. In the embodiment, the core region I is a storage region. The core component to be formed on the core region I includes selector. Data storage component is connected later on the core component. The selector may be, for example, MOS transistor or diode. The data storage component may be, for example, capacitor or variable resistor. One selector and one corresponding data storage component constitute a memory cell. Peripheral circuit TR (ex. NMOS transistor, PMOS transistor, diode and/or resistor) may be formed in the peripheral region II to control the memory cell. Multiple shallow trench isolations 301 are formed in the semiconductor substrate 300a. The shallow trench isolations 301 demarcate the border of core region I and peripheral region II (i.e. demarcating the boundary I-2 of core region I) on a two-dimensional plane. The active areas AA1 corresponding to core components in the core region I and the active areas AA2 corresponding to peripheral components in the peripheral region II are also demarcated at the same time, wherein the active area AA1 is in a strip pattern extending along a first direction on the two-dimensional plane, and the active area AA1 may be in stagger arrangement on the surface of semiconductor substrate 300a.

Thereafter, buried word lines WL are formed in the semiconductor substrate 300a. The buried word line WL is generally buried in a predetermined depth in the semiconductor substrate 300a, extending along a second direction (ex. column direction) through the shallow trench isolations 301 and the active area AA1. In this case, the second direction intersects but not perpendicular to the first direction. Buried word line WL functions as a switch to control the memory cells, which includes but not limited to doped semiconductor material (ex. doped Si), metal material (ex. W, Al, Ti or Ta), conductive metallic compound (ex. TiN, TaN or WN) or semiconductor compound (ex. SiN), etc. The sidewall and bottom of buried word line WL are usually surrounded by a gate dielectric layer (not shown), while the top of buried word line WL is buried in a gate capping layer 302.

Furthermore, the active areas AA1 at two sides of the buried word line WL may be doped with second type dopants, such as p-type or n-type dopant, to form source and drain (referred collectively as S/D1). One of the active areas AA1 at two sides of the buried world line WL is positioned at the center of active area AA1 that corresponds to predetermined bit line contact, while the other is at the position of predetermined storage node contact at the end of active areas AA1. Word lines WL and S/D1 may constitute or limit multiple MOS storage transistors on the core region I of semiconductor device. In addition, in the formation of S/D1, sources and drains (referred collectively as S/D2) corresponding to the peripheral transistors may also be formed in the peripheral region II. After the S/D1 and the S/D2 are formed, an etch stop layer may be further formed on the semiconductor substrate 300a to cover the S/D1 and the S/D2, with materials, for example, including silicon nitride (SiN) and/or silicon oxide ($SiO_2$), etc.

Thereafter, form multiple bit line contact plugs (not shown) on the S/D1 that serves as drains in the core region I and bit lines BL on the bit line contacts. The bit line contacts may be formed through following method: firstly, etch a S/D1 between two adjacent word lines WL formed in an active area AA1 to form recesses, then form a metal silicide in the recesses. Multiple parallel bit lines BL extend in a third direction (i.e. row direction) perpendicular to the buried word lines WL and, at the same time, cross over the active areas AA1 and the buried word lines WL. The bit line BL may include sequentially a semiconductor layer (ex. polysilicon, not shown), a barrier layer (ex. including Ti or TiN, not shown), a metal layer (ex. W, Al or Cu, not shown) and a mask layer (ex. including silicon nitride, silicon oxide or silicon carbonitride, not shown).

In addition, at least one gate structure G1 is formed on the peripheral region II of semiconductor 300a, for example, including a gate dielectric layer (not shown) and a gate electrode layer (not shown) stacked sequentially. In an embodiment, the gate electrode layer of the gate structure G1 and the semiconductor layer or metal layer of the bit line are formed integrally. Furthermore, various processes or single process may be used to form spacers 304 respectively surrounding the bit lines BL and the gate structures G1. For example, a process may be performed first to manufacture the spacers of gate structure G1, so that the spacers 304 of gate structure G1 include silicon oxide or silicon oxynitride (SiON). Another process is then performed to manufacture the spacers of bit lines BL, so that the spacers of bit lines may include silicon nitride. In addition, in the process of manufacturing the spacers of gate structure G1, an etching back process may be further performed to lower the overall height of gate structure G1 than the height of bit lines BL.

Figure 5:
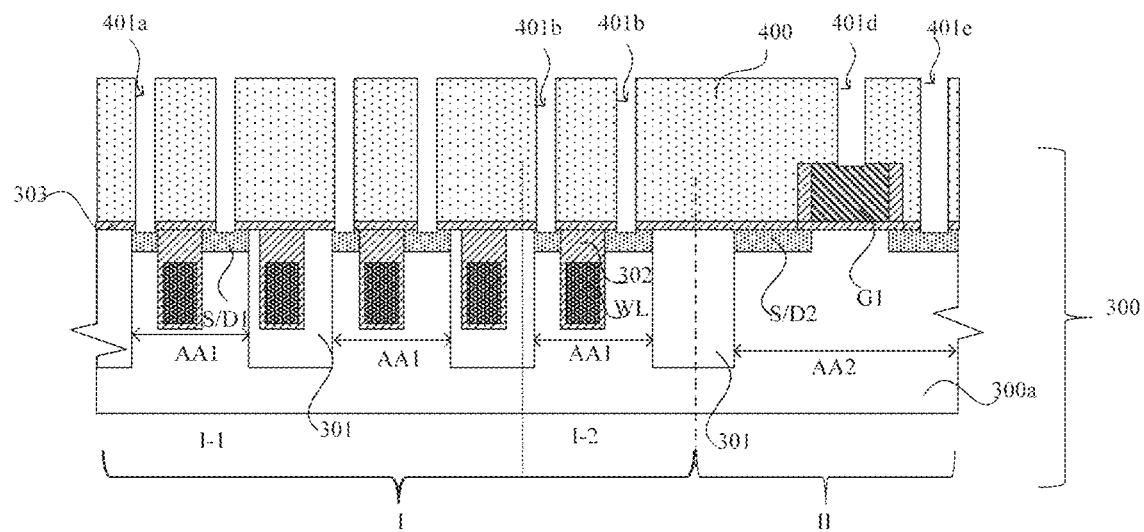

Thereafter, the method of manufacturing the contact structure of semiconductor device shown in FIGS. 1A-1D or FIGS. 2A-2D of the present invention may be used to form storage node contacts. The method of manufacturing the contact structure of semiconductor device shown in FIGS. 1A-1D will be used in following embodiment, with explicit procedure of:

Firstly, please refer to FIG. 5. After a semiconductor substrate 300a with bit lines BL, sources and drains S/D1 of the core components is provided, an interlayer dielectric layer 400 is formed on the semiconductor substrate 300a, with the material such as silicon oxide, silicon nitride or low-k dielectrics. Specifically, the interlayer dielectric layer 400 is covered on the semiconductor substrate 300a through a blanket deposition process. The spaces between bit lines BL are filled up and the bit lines and the gate structure G1 including spacers 304 are also buried therein. The interlayer dielectric layer 400 is then planarized through a chemical mechanical process to form an interlayer dielectric layer 400 with a roughly flat top surface, wherein the top surface of planarized interlayer dielectric layer 400 is at least not lower than the one of bit lines BL.

After that, please refer still to FIG. 5. A first mask pattern (not shown) is formed on the interlayer dielectric layer 400 through a photolithography process. The first mask pattern demarcates the positions of storage node contacts. The first mask pattern is then used as an etch mask to anisotropically etch the interlayer dielectric layer 400 and form the contact holes 401a, 401b, 401d and 401e exposing the corresponding sources S/D1, S/D2 below or the gate structures G1 below through the interlayer dielectric layer 400. Each contact hole 401a is positioned in the central region I-1 of core region I and exposes the source S/D1 of corresponding core component in the central region I-1, each contact hole 401b is positioned in the boundary I-2 of core region I and exposes the source S/D1 of corresponding core component in the boundary I-2, and each contact hole 401d, 401e is positioned in the peripheral region II and exposes the source/drain S/D2 or the gate structure G1 of corresponding peripheral component.

Figure 6:
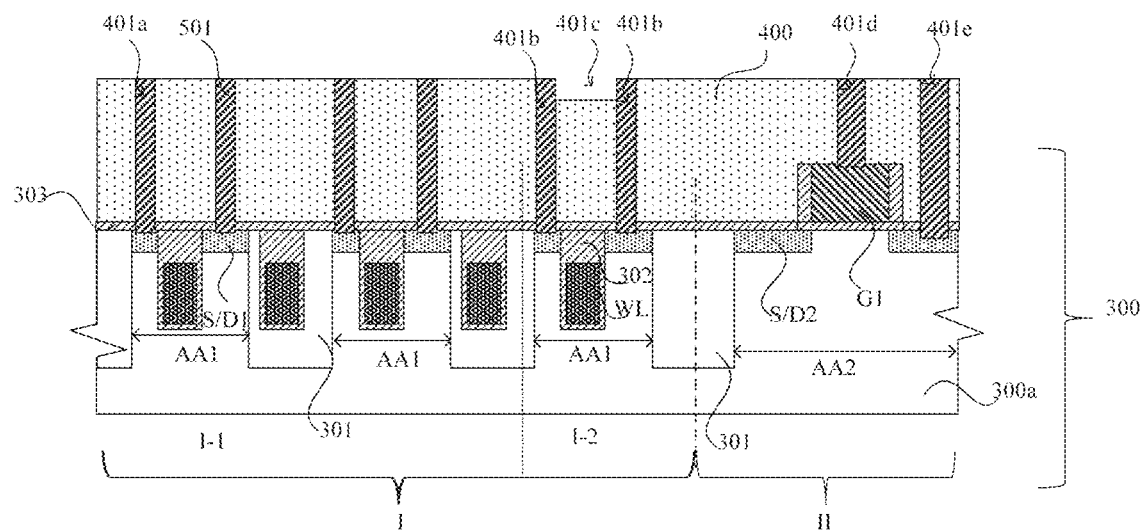

Thereafter, please refer to FIG. 6. After the contact holes 401a, 401b, 401d and 401e are formed, an ashing process or a wet clean process may be performed to remove the first mask pattern, and a sacrificial layer 501 is filled in the contact holes 401a, 401b, 401d and 401e. The sacrificial layer 501 may be formed by spin-on hardmask (SOH) or amorphous carbon layer (ACL), so that the sacrificial layer 504 can be used in the filling of contact holes 401a, 401b, 401d and 401e having higher aspect ratio.

After that, please refer still to FIG. 5 and FIG. 6. A second mask pattern (not shown) is formed on the interlayer dielectric layer 400 and the sacrificial layer 501. The second mask pattern demarcates the recess 401c with connecting tops of at least two corresponding contact holes 401b in the boundary I-2. The second mask pattern is used as a mask to etch the interlayer dielectric layer 400 in the boundary I-2 and form the recess 401c with connecting tops of at least two corresponding contact holes 401b (including at least one contact hole in a row of contacts closest to the peripheral region II) in the boundary I-2. The recess 401c crosses over at least one outermost word line WL in the boundary I-2.

Figure 7:
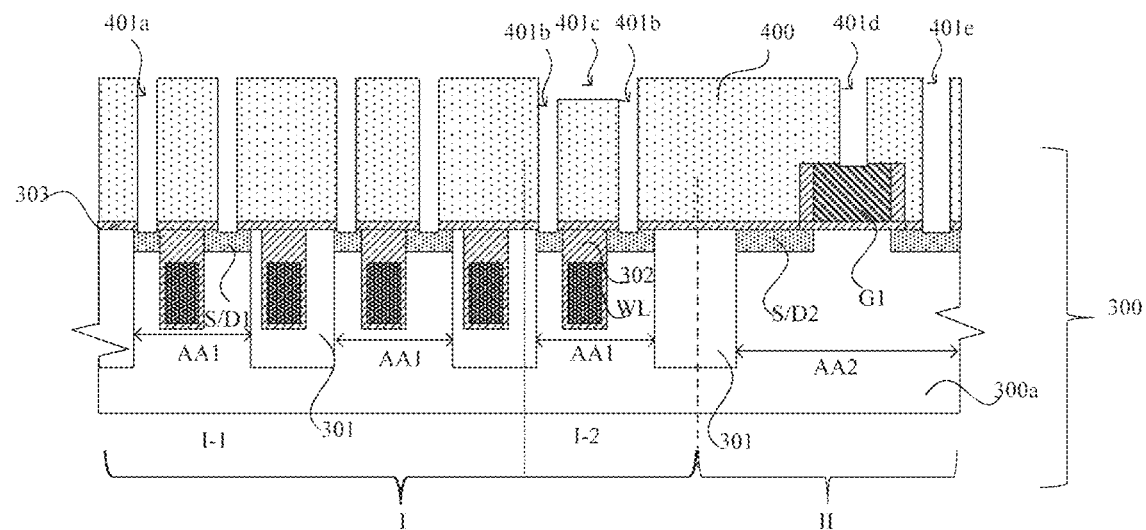

Thereafter, please refer to FIG. 7. The sacrificial layer 501 in the contact holes 401a, 401b, 401d and 401e and the second mask pattern may be removed by using an ashing process with oxygen, ozone or UV or by using a wet clean process, to re-expose the contact holes 401a, 401b, 401d, 401e and the recess 401c.

Figure 8:
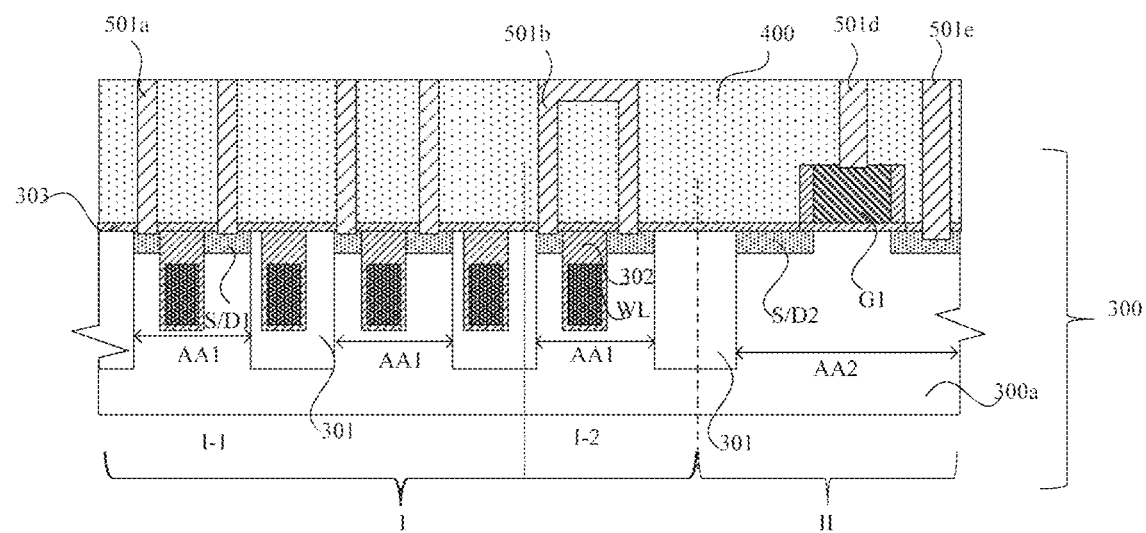

After that, please refer to FIG. 8. A metal barrier layer (not shown) may be formed in the contact holes 401a, 401b, 401d, 401e and the recess 401c. For example, the metal barrier layer may cover inner sidewalls of the contact holes 401a, 401b, 401d, 401e, the recess 401c and the top surface of interlayer dielectric layer 400 in an uniform thickness. The metal barrier layer may reduce or prevent the diffusion of metal materials in the contact holes 401a, 401b, 401d, 401e and the recesses 401c into the interlayer dielectric layer 400. For example, the metal barrier layer may be formed of Ta, TaN, TaSiN, Ti, TiN, TiSiN, W, WN or any combination thereof by using chemical vapor deposition (CVD), atomic layer deposition (ALD) or physical vapor deposition (PVD, ex. sputter) process, etc. Then, fill a metal layer in the contact holes 401a, 401b, 401d, 401e and the recess 401c to form contact plugs 501a, 501d, 501e and integrated contact 501b, wherein the metal layer may be formed of (one or more) refractory metal (such as Co, Fe, Ni, W and/or Mo). In addition, the metal layer may be formed by a deposition process with good step coverage, for example, by using chemical vapor deposition (CVD), atomic layer deposition (ALD) or physical vapor deposition (PVD, ex. sputter). The resultant metal layer further covers the surface of interlayer dielectric layer 400 surrounding the contact holes and the recess. Thereafter, a chemical mechanical polishing (CMP) process may be used to chemically and mechanically polish the top surface of deposited metal layer until the top surface of interlayer dielectric layer 400 exposed, thereby forming the contact plugs 501a, 501d, 501e and the integrated contact 501*b* in the interlayer dielectric layer 400. The contact plug 501*a* serves as a storage node contact in the central region I-1 of core region I to connect a capacitor formed later on the central region I-1. The integrated contact 501*b* is formed by at least two contact plugs (including the outermost contact plug electrically connecting the outermost source in the boundary I-2) with connecting tops in the boundary I-2 of core region I, to serve as a storage node contact in the boundary I-2 of core region I and connect the capacitor later on the boundary I-2. The top structure of integrated contact 501*b* (i.e. the top connection structure formed by all contact plugs with connecting tops) is positioned on a bit line BL and cross over at least one word line WL. The integrated contact 501*b* and the bit line BL are aligned in parallel. The integrated contact 501*b* may be, for example, an inverted-U contact or a comb contact, which at least crosses over one of the word lines WL in one outermost active area A1 of the boundary I-2. The contact plug 501*d* serves as a contact of the gate structure G1 in the peripheral region II to lead out the gate structure G1. The contact plug 501*e* serves as a contact of the source or the drain S/D2 in the peripheral region II to lead the source or the drain S/D21 out of the peripheral region II.

Figure 9:
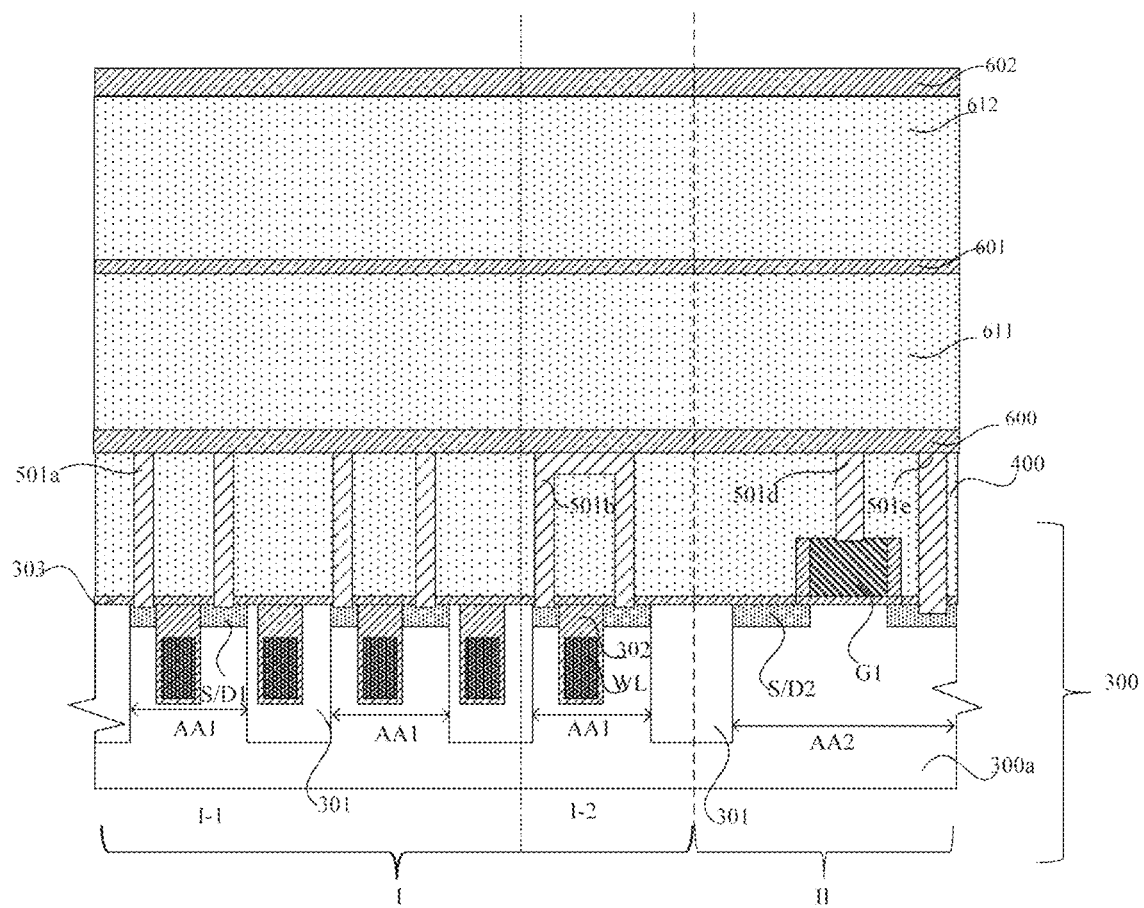

Afterward, conventional methods of manufacturing capacitors in the art may be used to manufacture corresponding capacitors. Please refer to FIGS. 9-12 with following explicit procedure:

Firstly, please refer to FIG. 9. A bottom supporting layer 600, a first sacrificial layer 611, a middle supporting layer 601, a second sacrificial layer 612 and a top supporting layer 602 may be subsequently formed on the surface of interlayer dielectric layer 400, contact plugs 501*a*, 501*d*, 501*e* and integrated contact 501*b* through chemical vapor deposition or sputter process, etc., wherein the bottom supporting layer 600 is used, for one thing, to provide bottom support for the bottom electrode formed in later processes, for another thing, to isolate the internal components of semiconductor substrate 300 and the capacitors thereon, etc. The method of forming bottom supporting layer 600 may be a thermal oxidation process. The material of bottom supporting layer 600, middle supporting layer 601 and top supporting layer 602 includes but not limited to silicon nitride. The material of first sacrificial layer 611 and second sacrificial layer 612 includes but not limited to silicon oxide. The thickness of first sacrificial layer 611 may determine the height of middle supporting layer 601 to be formed in later process, thus the thickness of first sacrificial layer 611 may be adjusted according to the height of required middle supporting layer 601 to be formed in later process. In the case that the thicknesses of first sacrificial layer 611 and middle supporting layer 601 are fixed, the thickness of second sacrificial layer 612 determines the height of top supporting layer 602 to be formed in later process, thus the thickness of second sacrificial layer 612 may be adjusted according to the height of required middle supporting layer 602 to be formed in later process. In other embodiment of present invention, at least two middle supporting layers 601 may be stacked between the bottom supporting layer 600 and the top supporting layer 602 in order to provide better support for the bottom electrode layer. A sacrificial layer is provided between adjacent middle supporting layers to provide isolation.

Figure 10:
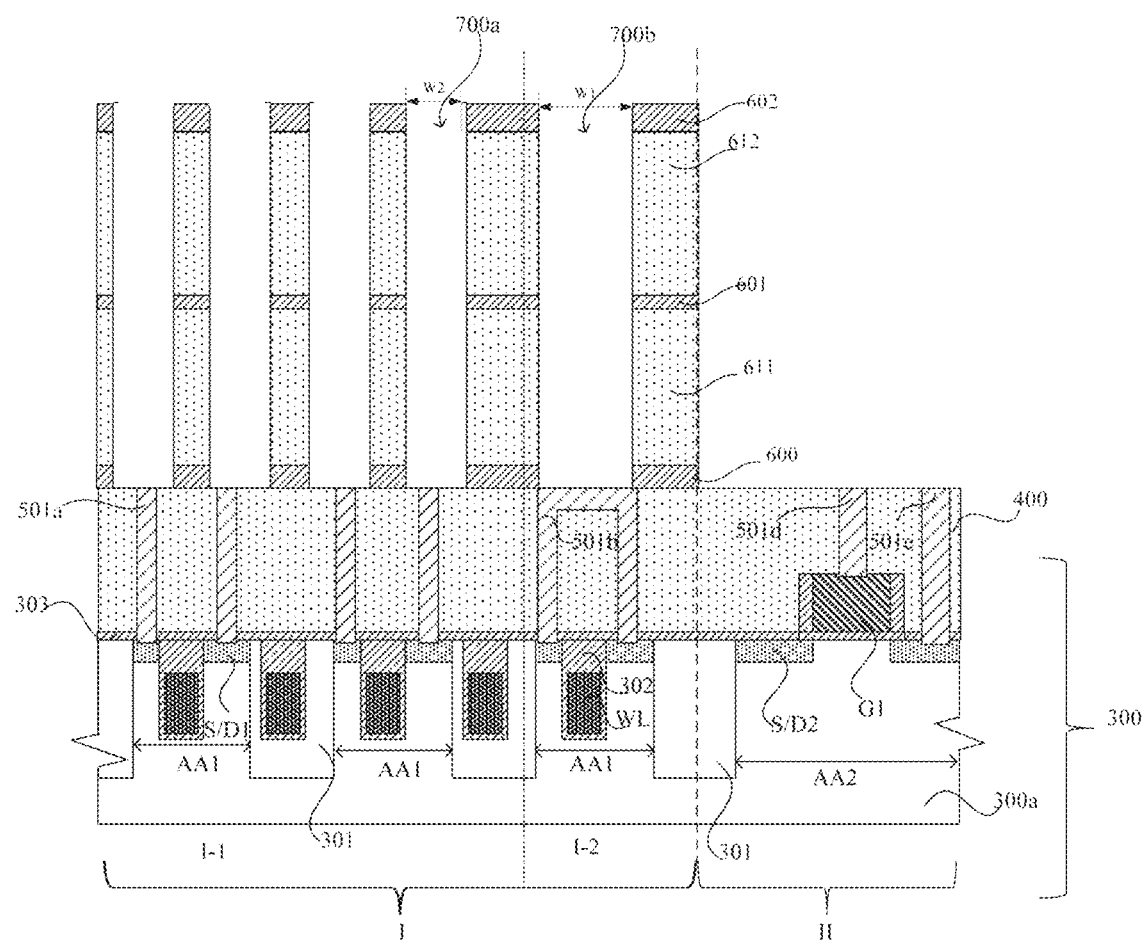

After that, please refer to FIG. 10. Multiple capacitor holes 700*a*, 700*b* are formed in the sacrificial layer and the supporting layer on the core region I. The capacitor hole 700*a* is formed in the central region I-1 of core region I and exposes the surface of contact plug 501*a* in the central region I-1 to be used for forming the capacitors in the central region I-1. The capacitor hole 700*b* is formed in the boundary I-2 of core region I and exposes the surface of integrated contact 501*b* in the boundary I-2 to be used for forming the capacitor in the boundary I-2. The capacitor holes 700*a*, 700*b* are arranged in an array. The capacitor hole 700*b* has a first width W1 and the capacitor hole 700*a* has a second width W2. Optionally, W1 is not smaller than a half of W2. Specifically, a mask layer (not shown) is formed on the top supporting layer 602. The mask layer is patterned to expose predetermined regions for forming the capacitor holes 700*a*, 700*b*. The patterned mask layer is then used as a mask to sequentially etch the top supporting layer 602, the second sacrificial layer 612, the middle supporting layer 601, the first sacrificial layer 611 and the bottom supporting layer 600, to remove the supporting layers and the sacrificial layers on the edge regions of peripheral region II and core region I and form multiple capacitor holes 700*a*, 700*b* in the core region I. The patterned mask layer is removed thereafter. The capacitor holes 700*a*, 700*b* pass sequentially through the top supporting layer 602, the second sacrificial layer 612, the middle supporting layer 601, the first sacrificial layer 611 and the bottom supporting layer 600 to expose the surface of corresponding contact plug 501*a* and integrated contact 501*b* in the core region I. Optionally, all contact holes may be arranged in a hexagonal close-packing. In addition, the capacitor hole may be in a shape of inverted trapezoid, rectangular with irregular sidewalls, such as curved sidewall, with no specific limitation. In addition, in the embodiment, the bottom supporting layer 600 remains on the peripheral region II to protect devices in the peripheral region II in later process of forming the capacitors.

It may be understood that, since the integrated contact 501*b* has larger area, it may provide sufficient process window to the manufacture of capacitor holes 700*b* in the boundary I-2 and provide the capacitor holes 700*b* in the boundary I-2 with larger width, thereby avoiding the deformation and collapse of the capacitor holes in the boundary. At the same time, it also provides larger contact area between the capacitor and the integrated contact formed in the boundary to decrease contact resistance and improve the electrical performance of devices. In addition, since the contact hole 700*b* in the boundary I-2 has larger width, the density difference of circuit patterns between the core region I and the peripheral region II may be buffered to improve optical proximity effect when performing photolithography processes and/or etching process and to mitigate loading effect in dense/isolated regions. It also ensures the uniformity of capacitor holes inside the border of core region to prevent the anomaly of contact holes on the contact plugs at some positions in the core region and capacitor failure caused by the anomaly.

Figure 11:
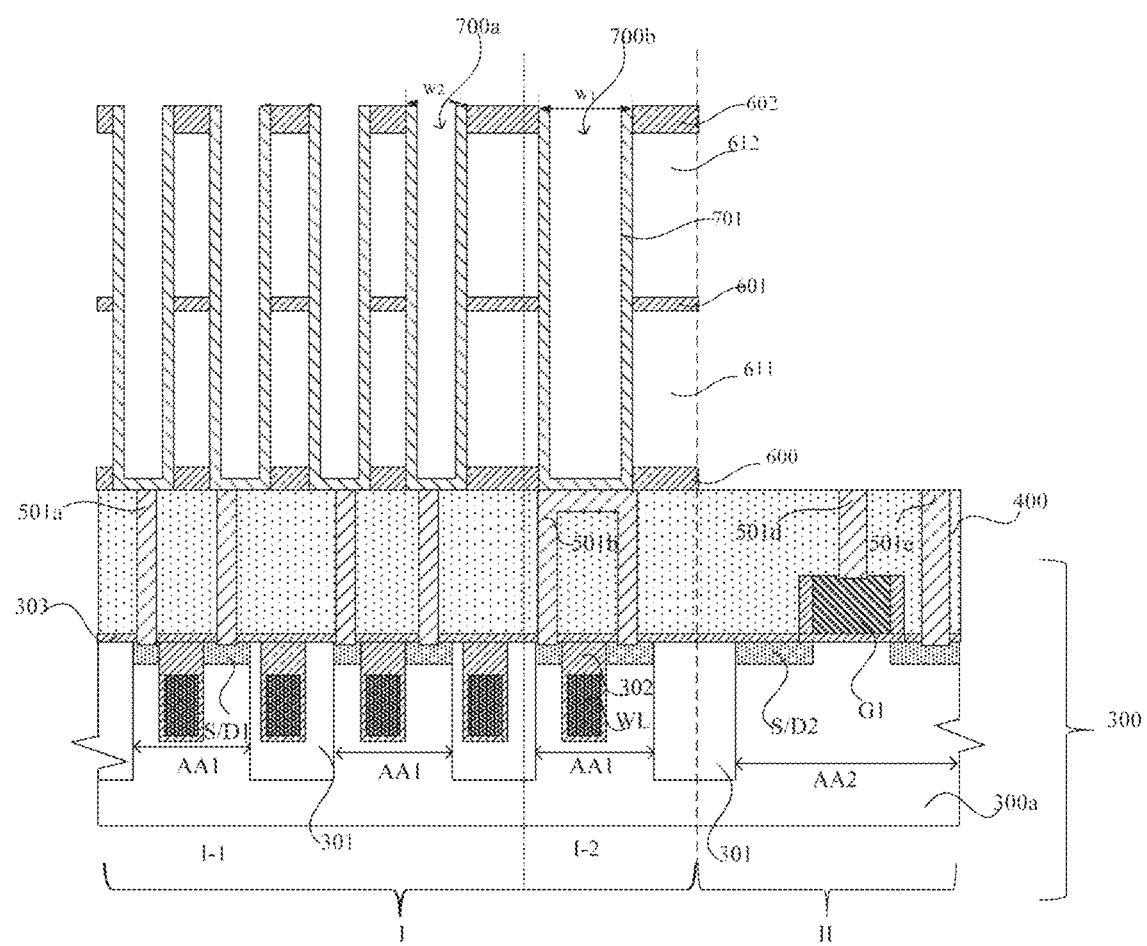

Please refer to FIG. 11. A bottom electrode layer 701 is formed covering on the sidewalls and bottoms of capacitor holes 700*a*, 700*b*. The portion of bottom electrode layer 701 in the capacitor holes 700*a*, 700*b* resembles the capacitor holes 700*a*, 700*b*, so that the bottom electrode layer 701 in the capacitor holes 700*a*, 700*b* forms a cylindrical structure. Specifically, the bottom electrode layer 701 may be formed on the basic of deposition process cooperating with a planarization process. For example, firstly, the peripheral region II may be protected by a patterned protective layer (not shown) such as photoresist and expose the top surface of top supporting layer 602 and the surface of capacitor holes 700*a*, 700*b* in the core region I. After that, form an electrode material layer on the patterned protective layer and the exposed surface of core region I through processes like PVD or CVD. The electrode material layer covers the bottoms and sidewalls of capacitor holes 700a, 700b and covers the top surface of top supporting layer 602 in the core region I and the patterned protective layer in the peripheral region II. A planarization process (ex. CMP process) is then performed to remove the portion of electrode material layer on the top supporting layer 602, so that the remaining electrode material layer is only formed in the capacitor holes 700a, 700b to form a bottom electrode layer 701 with multiple cylindrical structures. The patterned protective layer is removed thereafter. In addition, in the embodiment, the contact plugs 501a, 501b are exposed respectively from the capacitor holes 700a, 700b so that the bottoms of cylindrical structures of the bottom electrode layer 701 may be electrically connected with the contact plugs 501a, 501b. Furthermore, the bottom electrode layer 701 may be a polysilicon electrode or a metal electrode. In the case that the bottom electrode layer 701 is a metal electrode, titanium nitride (TiN) and Ti stacked structure may be used. In the case that the bottom electrode layer 701 is a polysilicon electrode, it may be formed by undoped and/or doped polysilicon materials.

Please refer still to FIG. 11. The sacrificial layers are removed and the supporting layers are remained to form lateral supporting layers laterally connecting sidewalls of the multiple cylindrical structures of bottom electrode layer 701 and support the bottom electrode layer 701 on the sidewalls of multiple cylindrical structures. Specifically, the top supporting layer 602 surrounds the tops of cylindrical structures of bottom electrode layer 701, the middle supporting layer 601 is in the middle of cylindrical structures of bottom electrode layer 701, and the bottom supporting layer 600 surrounds the bottoms of cylindrical structures of bottom electrode layer 701, wherein explicit procedure includes: form a first opening (not shown) in the top supporting layer 602 and expose the second sacrificial layer 612; the second sacrificial layer 612 may be removed by using wet etching process; form a second opening in the middle supporting layer 601 and expose the first sacrificial layer 611, wherein each of the first opening only overlays one of the capacitor holes 700a or 700b. Alternatively, each of the first opening overlays a plurality of the capacitor holes 700a and/or 700b at the same time. In addition, the second opening may completely align with the first opening.

Please refer to FIG. 12. A capacitor dielectric layer 702 is formed on the inner surface and outer surface of the bottom electrode layer 701 and on exposed surfaces of the supporting layers by using CVD or ALD process, and then, a top electrode layer 703 is formed on the inner surface and outer surface of the capacitor dielectric layer 702, wherein the capacitor dielectric layer 702 covers the inner surface and outer surface of the cylindrical structures of the bottom electrode layer 701 to complete utilize the two opposite surfaces of bottom electrode layer 701 and form the capacitors with larger electrode area. Preferably, the capacitor dielectric layer 702 may be a high-k dielectric like metal oxide. Furthermore, the capacitor dielectric layer 702 may be a multilayer structure, such as a two-layer structure of hafnium oxide-zirconium oxide. The top electrode layer 703 may be a monolayer structure or a multilayer structure. In the case that the top electrode layer 703 is a monolayer structure, it may be, for example, a polysilicon electrode or a metal electrode. In the case that the top electrode layer 703 is a metal electrode, it may be formed, for example, by titanium nitride (TiN). The top electrode layer 703 may constitute capacitors with the capacitor dielectric layer 702 and the bottom electrode layer 701 either inside or outside the corresponding cylindrical structures. In addition, since the presence of lateral supporting layer (i.e. the middle supporting layer 601 and the top supporting layer 602) on the edge region of core region I (i.e. the border region of an array of the capacitor holes), the capacitor dielectric layer 702 and the top electrode layer 703 are provided with uneven sidewall structures. The uneven sidewall structure corresponds to the middle supporting layer 601 and the top supporting layer 602 outside the cylindrical structures of bottom electrode layer 701, thus the portion of top electrode layer 703 on the edge region of core region I (i.e. the border region of the array of capacitor holes) would protrude away from the bottom electrode layer 701 in a direction corresponding to the middle supporting layer 601 and the top supporting layer 602, to form an uneven border of the capacitor array in the core region I. In addition, in the embodiment, the capacitor dielectric layer 702 and the top electrode layer 703 further extend sequentially to cover on the surface of bottom supporting layer 600 remaining on the peripheral region II.

Please refer to FIG. 12. A top electrode filling layer 704 may be first formed on the surface of top electrode layer 703 through a CVD process to fill up the gaps between the top electrode layers 703. That is, the top electrode filling layer 704 fills up the gaps between adjacent cylindrical structures and covers the structure formed in the aforementioned processes. Preferably, the material of top electrode filling layer 704 includes undoped polysilicon and boron-doped polysilicon. Accordingly, the manufacture of capacitor array is completed, with the capacitors 705a formed on the central region I-1 and the capacitors 705b formed on the boundary I-2.

Since the width of capacitor hole 700b is larger than the width of capacitor hole 700a, the width (i.e. W1) of capacitors 705b in the boundary I-2 is larger than the width (i.e. W2) of capacitors 705a in the central region I-1. For example, W1=W2*1.5, and since the capacitor hole 700b has larger size, it may facilitate the material filling and, therefore, improve the performance of capacitors formed in the boundary I-2.

Figure 13:
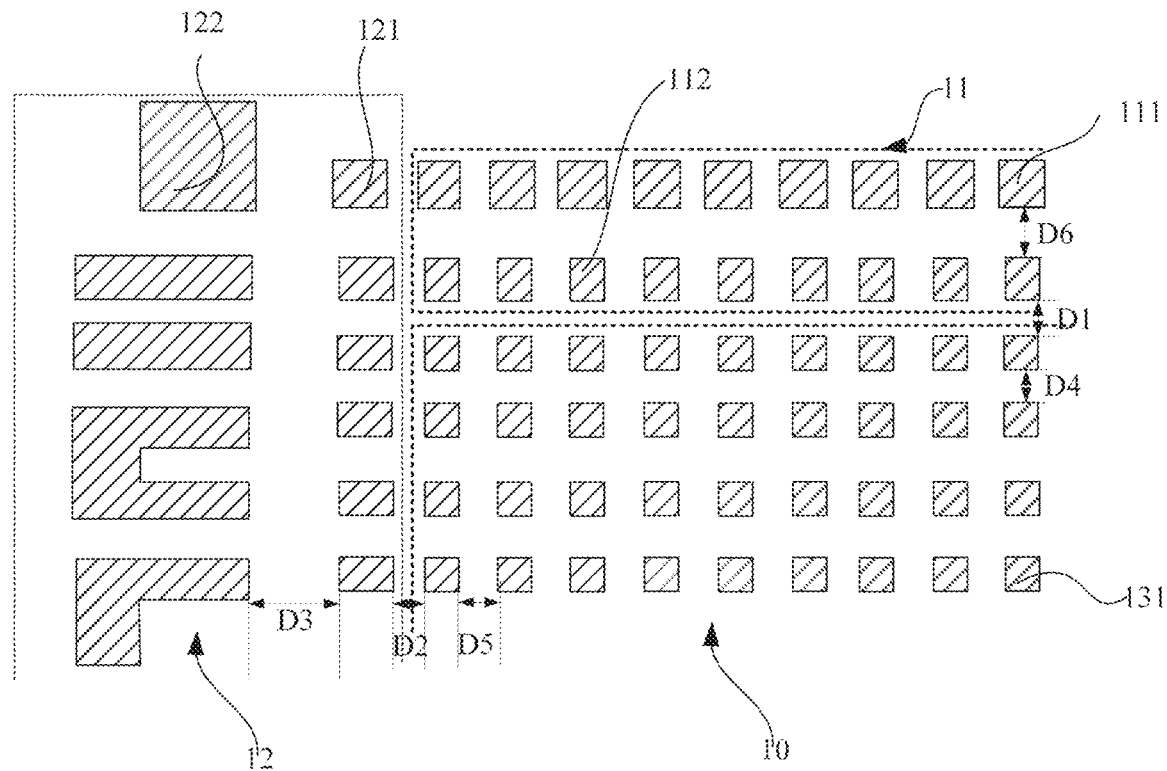
FIG. 13 is a schematic view of a contact pad layout in an embodiment of the present invention.

Afterward, please refer to FIG. 13. A contact pad layout of a semiconductor device is provided in an embodiment of the present invention. The contact pad layout includes a primary layout region 10 and a first edge layout region 11, wherein the primary layout region 10 is provided with multiple primary contact pad patterns 131. The shapes and sizes of primary contact pad patterns 131 are similar to each other, and all primary contact pad patterns 131 are arranged in a checkerboard pattern. Two adjacent columns of the primary contact pad patterns 131 have a fourth spacing D4 therebetween, while two adjacent rows of the primary contact pad patterns 131 have a fifth spacing D5 therebetween. D4 may be or may not be equal to D5. The first edge layout region 11 is demarcated outside one edge of the primary layout region 10. The first edge layout region 11 is provided with multiple first edge contact pad patterns arranged in two columns along the extending direction of the edge of primary layout region 10. That is, in the embodiment, the first edge layout region 11 is provided with one column of the first edge contact pad patterns 111 and one column of the first edge contact pad patterns 112. The two columns of first edge contact pad patterns 111, 112 have a sixth spacing D6 therebetween. The column of first edge contact pad patterns 112 is relatively close to the primary layout region 10, and the first edge contact pad patterns 112 in this column may or may not have identical shape and size. The first edge contact pad patterns 111, 112 are arranged aligning (ex. aligning by row) with corresponding primary contact pad patterns 131 in the primary layout region 10. The spacing between the column of first edge contact pad patterns 112 closest to the primary layout region 10 and one adjacent column of primary contact pad patterns 131 is the first edge spacing D1 (ex. the first edge layout region 11 and the primary layout region 10 have a first edge spacing D1 therebetween). The area of each first edge contact pad pattern 111, 112 is larger than the area of each primary contact pad pattern 131, and the first edge contact pad pattern 111, 112 is not identical to the primary contact pad pattern 131 (ex. the area of every first edge contact pad patterns 111, 112 is larger than the area of primary contact pad pattern 131). The first edge spacing D1 is different from the fourth spacing D4. The sixth spacing D6 is different from the fourth spacing D4 and the first edge spacing D1. For example, D6 is larger than D1, and D1 is larger than D4.

Optionally, please refer still to FIG. 13. The contact pad layout of the embodiment further includes a second edge layout region 12. The second edge layout region 12 is demarcated outside an edge adjacent to the edge of the primary layout region 10. The second edge layout region 12 is provided with multiple second edge contact pad patterns 121 and/or 122, and every second edge contact pad pattern 121, 122 is different from the primary contact pad pattern 131, and the area of every second edge contact pad pattern 121, 122 is larger than the area of every primary contact pad pattern 131. The second edge layout region 12 and the primary layout region 10 have a second edge spacing D2 therebetween. The second edge spacing D2 is different from the fourth spacing D4 and also different from the fifth spacing D5, and may be also different from the first edge spacing D1. In addition, the second edge contact pad patterns 121, 122 in the second edge layout region 12 are arranged aligning with corresponding primary contact pad pattern 131 and the first edge contact pad patterns 111, 112 in the primary layout region 10. For example, all second edge contact pad patterns 121, 122 in the second edge layout region 12 are further aligned in two rows along the extending direction of the adjacent side. The row adjacent to the primary layout region 10 is the second edge contact pad patterns 121, while the row farther from the primary layout region 10 is the second edge contact pad patterns 122. The contact pad patterns 111, 112 in each row may not be identical. The spacing of the row of second edge contact pad patterns 121 closest to the primary layout region 10 and one adjacent row of the primary contact pad pattern 131 is the second edge spacing D2. Two rows of the second edge contact pad patterns 121, 122 have a third spacing D3 therebetween. The third spacing D3 is larger than the second edge spacing D2. Optionally, in the second edge layout region 12, the shape of second edge contact pad patterns 122 in the row farther from the primary layout region 10 includes at least two shapes selected from rectangle, left-turned U-shape, right-turned U-shape, left-turned L-shape, right-turned L-shape and comb shape with at least two comb teeth.

Figure 14:
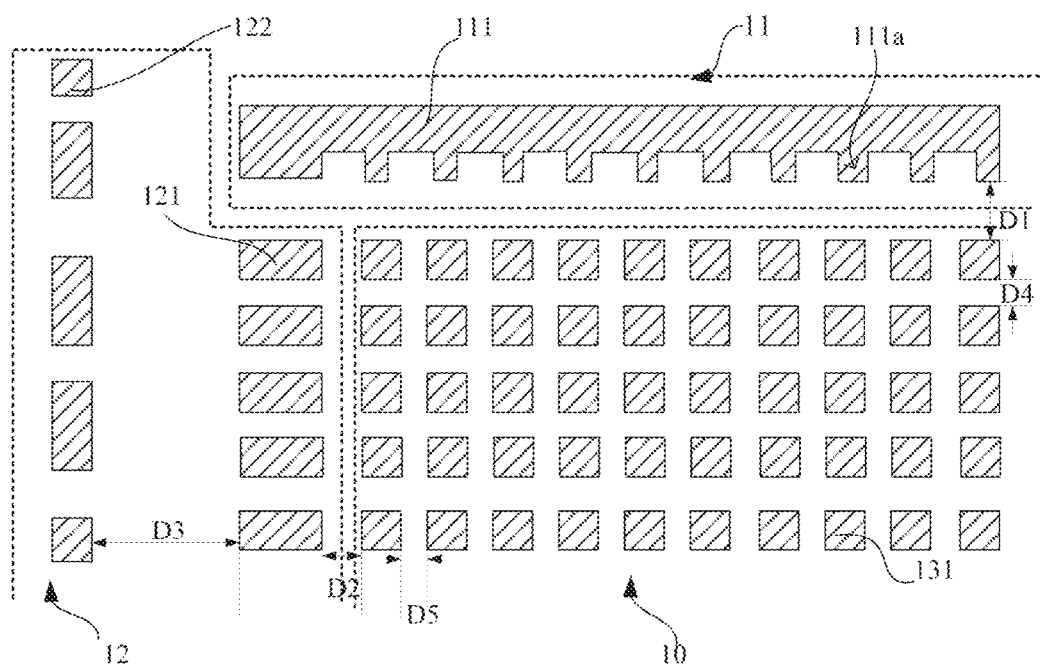
FIG. 14 is a schematic view of a contact pad layout in another embodiment of the present invention.

Please refer to FIG. 14. A contact pad layout of semiconductor device is provided in another embodiment of the present invention. The contact pad layout includes a primary layout region 10, a first edge layout region 11 and a second edge layout region 12, wherein the primary layout region 10 is provided with multiple primary contact pad patterns 131. The shapes and sizes of primary contact pad patterns 131 are similar to each other, and all primary contact pad patterns 131 are arranged in a checkerboard pattern. Two adjacent columns of the primary contact pad patterns 131 have a fourth spacing D4 therebetween, while two adjacent rows of the primary contact pad patterns 131 have a fifth spacing D5 therebetween. D4 may or may not be equal to D5. The first edge layout region 11 is demarcated outside one edge of the primary layout region 10. The edge layout region 11 is provided with one strip with zigzag edge to serve as the first edge contact pad pattern 111. Optionally, the zigzag edge faces the primary layout region 10. The teeth 111a of zigzag edge are arranged aligning with corresponding primary contact pad patterns 131 in the primary layout region 10 (for example, the teeth 111a are aligned by row with corresponding primary contact pad patterns 131). The spacing between the teeth 111a and the closest aligning primary contact pad patterns 131 is the first edge spacing D1. That is, in the embodiment, the first edge layout region 11 is only provided with one column of the first edge contact pad patterns 111. The first edge contact pad patterns 111 in this column are connected together. The shape and size of each tooth may or may not be identical. The spacing between teeth 11a may not be identical. The area of each tooth may be smaller, equal or larger than the area of each primary contact pad patterns 131. The first edge spacing D1 is different form the fourth spacing D4. The second edge layout region 12 is demarcated outside an edge adjacent to the edge of the primary layout region 10. The second edge pattern region 12 is provided with multiple second edge contact pad patterns 121 and/or 122, and every second edge contact pad pattern 121, 122 is different from the primary contact pad pattern 131, and the area of every second edge contact pad pattern 121, 122 is larger than the area of primary contact pad pattern 131. The second edge layout region 12 and the primary layout region 10 have a second edge spacing D2 therebetween. The second edge spacing D2 is different from the fourth spacing D4 and different from the fifth spacing D5, and may be also different from the first edge spacing D1. In addition, the corresponding second edge contact pad patterns 121, 122 in the second edge layout region 12 are arranged aligning with corresponding primary contact pad pattern 131 in the primary layout region 10, while other second edge contact pad patterns 121, 122 are arranged aligning with the first edge contact pad patterns 111. For example, the corresponding second edge contact pad patterns 121, 122 in the second edge layout region 12 may be further aligned in two rows along the extending direction of the adjacent edge. The row adjacent to the primary layout region 10 is the second edge contact pad patterns 121, while the row farther from the primary layout region 10 is the second edge contact pad patterns 122. The second edge contact pad patterns 121, 122 in each row may not be identical. The spacing between the row of second edge contact pad patterns 121 closest to the primary layout region 10 and one closest row of the primary contact pad pattern 131 is the second edge spacing D2. Two rows of the second edge contact pad patterns 121, 122 have a third spacing D3 therebetween. The third spacing D3 is larger than the second edge spacing D2 and also larger than the fifth spacing D5. In the embodiment, the second edge contact pad patterns 121 is horizontal strip structure, with a length extending along the column direction of the primary layout region 10. The second edge contact pad patterns 122 is vertical strip structure, with a length extending along the row direction of the primary layout region 10.

Figure 15:
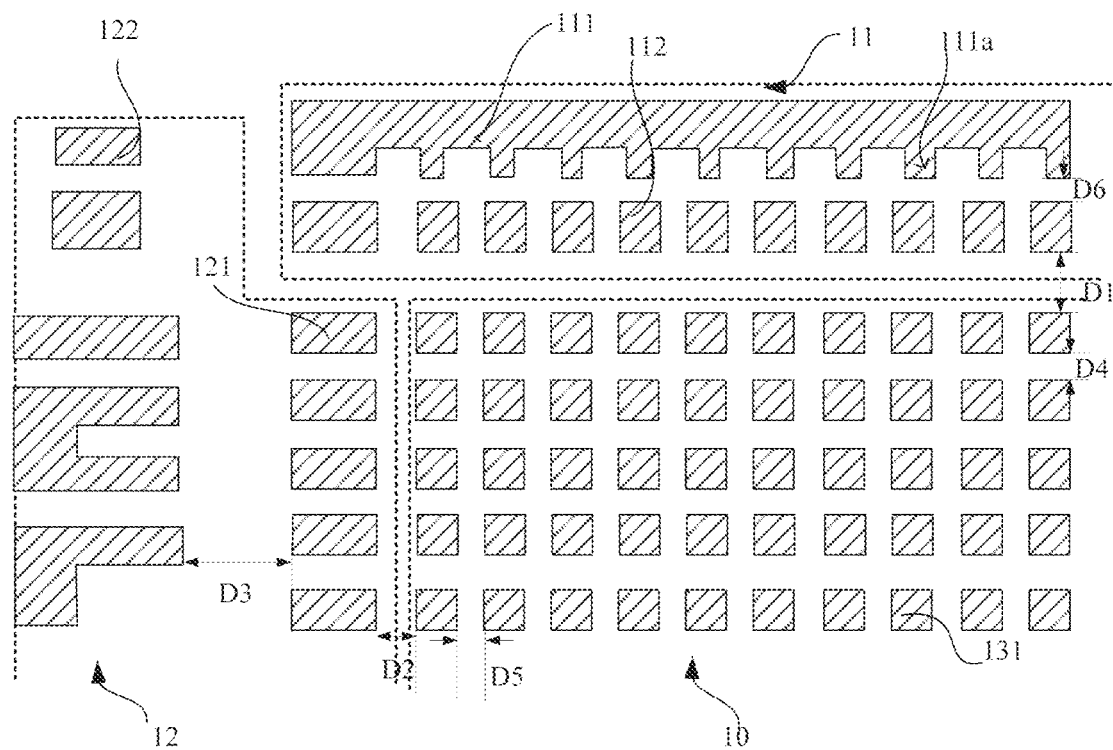
FIG. 15 is a schematic view of a contact pad layout in still another embodiment of the present invention.

Please refer to FIG. 15. A contact pad layout of semiconductor device is provided in still another embodiment of the present invention. The contact pad layout includes a primary layout region 10, a first edge layout region 11 and a second edge layout region 12. The structure in the primary layout region 10 of this embodiment is identical to the primary layout region 10 shown in the embodiment of FIG. 13 or FIG. 14, thus it will not be herein repeated. The first edge layout region 11 is demarcated outside one edge of the primary layout region 10. The edge layout region 11 is provided with two-column structures, wherein the column close to the primary layout region 10 is provided with multiple first edge contact pad patterns 112, while the column farther from the primary layout region 10 is provided with one strip having zigzag edge to serve as the first edge contact pad patterns 111. Optionally, the zigzag edge faces the primary layout region 10. The teeth 111a of zigzag edge and corresponding first edge contact pad patterns 112 are arranged aligning with corresponding primary contact pad patterns 131 in the primary layout region 10 (for example, the teeth 111a, first edge contact pad patterns 112 are aligns by row with corresponding primary contact pad patterns 131). The spacing between the first edge contact pad patterns 112 and the closest aligning primary contact pad patterns 131 is the first edge spacing D1 (ex. the column spacing between one column of the first edge contact pad patterns 131 and the closest primary contact pads 131 is the first edge spacing D1). The column spacing between one column of the first edge contact pad patterns 112 and one column of the first edge contact pad patterns 111 with zigzag edge is sixth spacing D6, wherein the first edge contact pad patterns 111 are connected together, and the shapes and sizes of teeth 111a may or may not be identical. The spacing between teeth 111a may or may not be identical. The area of each tooth 111a may be smaller, equal or larger than the area of each primary contact pad patterns 131. The first edge spacing D1 is different form the fourth spacing D4. The sixth spacing D6 is different form the first edge spacing D1. The second edge layout region 12 is demarcated outside one edge adjacent to the edge of primary layout region 10. The second edge pattern region 12 is provided with multiple second edge contact pad patterns 121 and/or 122, and every second edge contact pad pattern 121, 122 is different from the primary contact pad pattern 131, and the area of every second edge contact pad pattern 121, 122 is larger than the area of every primary contact pad pattern 131. The second edge layout region 12 and the primary layout region 10 have a second edge spacing D2 therebetween. The second edge spacing D2 is different from the fourth spacing D4 and different from the fifth spacing D5, and may also be different from the first edge spacing D1. In addition, the corresponding second edge contact pad patterns 121, 122 in the second edge layout region 12 are arranged aligning with corresponding primary contact pad pattern 131 in the primary layout region 10, while the other second edge contact pad patterns 121, 122 are arranged aligning with the first edge contact pad patterns 111. For example, the corresponding second edge contact pad patterns 121, 122 in the second edge layout region 12 may further be arranged in two rows along the direction of the adjacent edge. The row close to the primary layout region 10 is the second edge contact pad patterns 121, while the row farther from the primary layout region 10 is the second edge contact pad patterns 122. The second edge contact pad patterns 121, 122 in each row may not be identical. The spacing between the row of second edge contact pad patterns 121 closest to the primary layout region 10 and one closest row of the primary contact pad patterns 131 is the second edge spacing D2. Two rows of the second edge contact pad patterns 121, 122 have a third spacing D3 therebetween (The smallest spacing between the two rows of second edge contact pad patterns 121, 122 is the third spacing D3). The third spacing D3 is larger than the second edge spacing D2 and also larger than the fifth spacing D5. In the embodiment, the second edge contact pad pattern 121 is horizontal strip structure, with a length extending along the column direction of primary layout region 10. The shape of second edge contact pad patterns 122 includes at least two shapes selected from rectangle, left-turned U-shape, right-turned U-shape, left-turned L-shape, right-turned L-shape and comb shape with at least two comb teeth.

In the contact pad layouts of semiconductor device provided in the embodiments of present invention, the primary layout region corresponds to the active areas in core region of semiconductor device or all regions in the core region of semiconductor device, and the contact pad patterns are used to manufacture the primary contact pads in the core region of semiconductor device. The first edge layout region and the second edge layout region correspond respectively to the boundary at corresponding sides of the core region or correspond respectively to the border regions between the core region of semiconductor device and the peripheral regions of semiconductor device at corresponding sides. The first edge contact pad patterns and the second edge contact pad patterns are both used to manufacture dummy contact pads in the boundary at corresponding sides of the core region of semiconductor device or in the border region. Since the area of each first edge contact pad pattern in the first edge layout region is larger than the area of each primary contact pad pattern, the area of each second edge contact pad pattern in the second edge layout region is larger than the area of each primary contact pad pattern. Therefore, in the case that the primary contact pads in the core region are formed based on the contact pad layout in the embodiments of present invention, the first edge contact pad patterns and the second edge contact pad patterns may be used to form corresponding dummy contact pads, and the top area of the resultant dummy contact pad is larger than the top area of the resultant primary contact pad. Accordingly, the size of electronic structure connected later on the dummy contact pad may be increased, to improve the dense/isolated loading effect of the circuit pattern between the core region and the peripheral region when connecting the electronic structures on the primary contact pads and dummy contact pads, thereby improving the uniformity of electronic structures connected on the primary contact pads in the core region, as well as avoiding structural anomaly of the electronic structures connected on the primary contact pads in the boundary of core region and improving the performance of resultant semiconductor devices.

Figure 24:
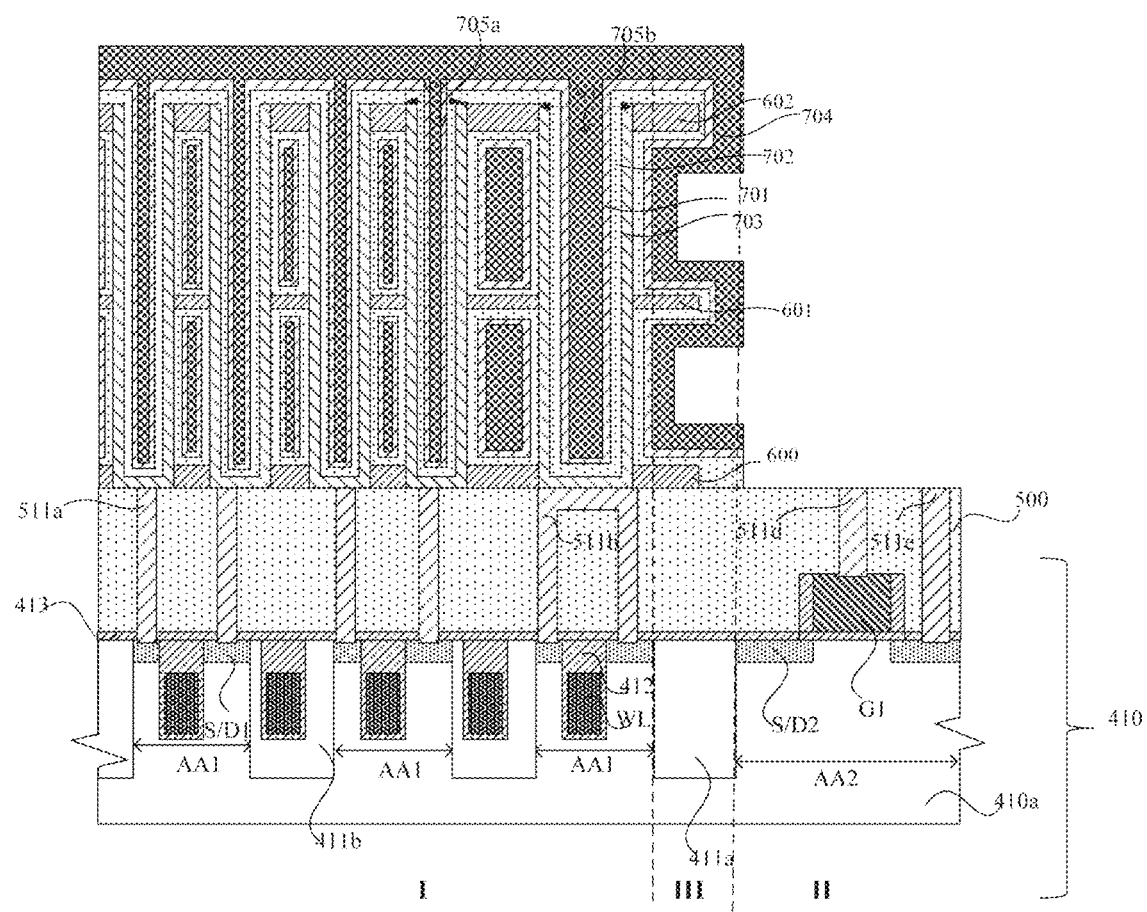

Please refer to FIGS. 13-15 and FIG. 16A. Based on the same invention concept, one embodiment of the present invention further provide a contact structure formed by using the contact pad layout of semiconductor device shown in either one of FIGS. 13-15. The contact pads includes: multiple primary contact pads 131a and at least one first edge contact pad 111b. The primary contact pads 131a are formed based on corresponding primary contact pad patterns 131 in the primary layout region 10, which are arranged in a checkerboard pattern in the core region I of semiconductor device. The shapes and sizes of the primary contact pads 131a are similar, and the primary contact pad patterns 131a have a fourth spacing D4 therebetween. The primary contact pad patterns 131a are used to connect valid electronic structures above, such as capacitors (as the 705a shown in FIG. 24). The first edge contact pads 111b are formed based on the first edge contact pad patterns 111 or based on the first edge contact pad patterns 111 and 112. The first edge contact pads 111b are disposed outside one edge of all primary contact pad regions, and the top area of each first edge contact pads 111b is larger than the top area of each primary contact pad (more specifically, the cross-sectional area of each first edge contact pad 111b is larger than the cross-sectional area of each primary contact pad), the first edge contact pad 111*b* adjacent to the primary contact pads 131*a* (manufactured based on the first edge contact pads 111) and the primary contact pads 131*a* have a first edge spacing D1 therebetween, wherein the size of first edge contact pad 111*b* is different form the size of primary contact pad patterns 131*a*, and the first edge spacing D1 is different form the fourth spacing D4. In the embodiment, the first edge contact pads 111*b* are disposed in the boundary of core region I and connects at least two outermost source/drains S/D1 in the boundary of core region I (as shown in FIG. 24, the first edge contact pad 511*b* crosses over the word line and two source/drains S/D1 at two sides thereof in the boundary of core region I). The first edge contact pad 111*b* may be used as a dummy contact pad. Since the top area of each first edge contact pad 111*b* is larger than the top area of each primary contact pad 131*a*, the electronic structure connected later on the first edge contact pad 111*b* may have larger size than the electronic structure connected later on the primary contact pad 131*a* (as shown in FIG. 24, the size of capacitor 705*b* is larger than the size of capacitor 705*a*), to decrease contact resistance between the first edge contact pad 111*b* and the electronic structure connected thereon and improve the reliability of devices. More importantly, when the corresponding electronic structures are connected respectively on the primary contact pad 131*a* and the first edge contact pad 111*b*, the relative size increasing of the electronic structure connected on the first edge contact pad 111*b* may be used to improve the uniformity of electronic structures connected on all primary contact pads 131*a* in the core region I and, at the same time, avoid the anomaly of electronic structure connected on the primary contact pad 101*a* in the boundary of core region I (i.e. the primary contact pads 101*a* adjacent to the first edge contact pads 111*b*), thereby improving the performance of resultant semiconductor device.

Figure 25:
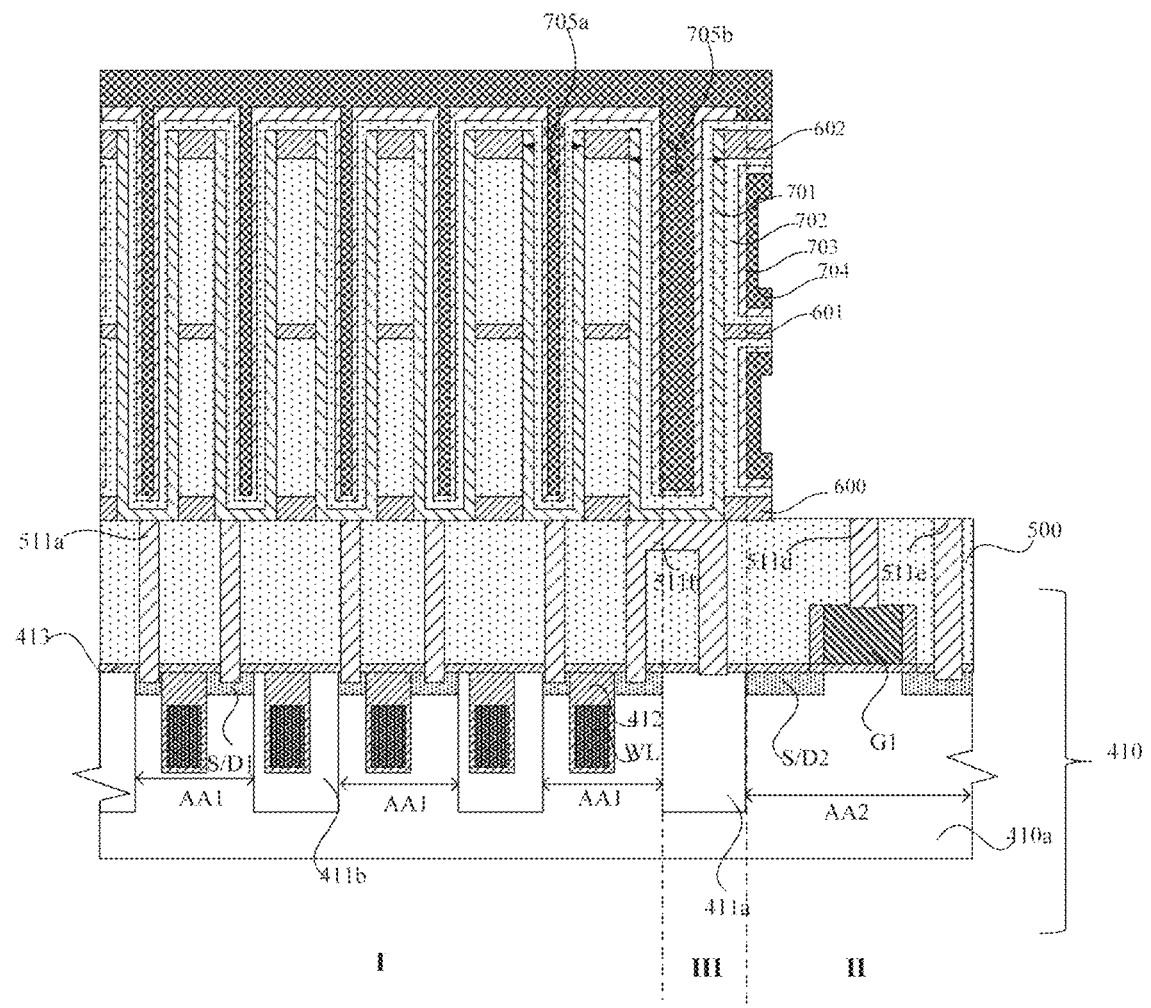

Please refer to FIGS. 13-15 and FIG. 16B. Another embodiment of the present invention further provides contact pads formed by using the contact pad layout of semiconductor device shown in either one of FIGS. 13-15. The contact pads include: multiple primary contact pads 131*a* and at least one first edge contact pad 111*b*. The primary contact pads 131*a* are manufactured based on the corresponding primary contact pad patterns 131 in the primary layout region 10, which are arranged in a checkerboard pattern in the core region I of semiconductor device. The shapes and sizes of the primary contact pads 131*a* are similar, and the primary contact pads 131*a* have a fourth spacing D4 therebetween. The primary contact pads 131*a* are used to connect valid electronic structures above, such as capacitors (as the 705*a* shown in FIG. 24). The first edge contact pads 111*b* are manufactured based on the first edge contact pad patterns 111 or based on the first edge contact pad patterns 111 and 112. The first edge contact pads 111*b* are disposed outside one edge of all primary contact pad regions, and the top area of each first edge contact pads 111*b* is larger than the top area of each primary contact pad (more specifically, the cross-sectional area of each first edge contact pad 111*b* is larger than the cross-sectional area of each primary contact pad), the first edge contact pad 111*b* adjacent to the primary contact pads 131*a* (formed based on the first edge contact pads 111) and the primary contact pads 131*a* have a first edge spacing D1 therebetween, wherein the size of first edge contact pad 111*b* is different form the size of primary contact pad patterns 131*a*, and the first edge spacing D1 is different form the fourth spacing D4. In the embodiment, the first edge contact pads 111*b* are disposed in the border region III between the core region I and the peripheral region II and are electrically connected with at least one source/drain S/D1 in the boundary of core region I (as shown in FIG. 25, the first edge contact pad 511*b* extends from the border region III onto one outermost source/drain S/D1 in the boundary of core region I, to connect the shallow trench isolation (STI) 411*a* in the border region III and the source/drain S/D1 adjacent to the shallow trench isolation 411*a*). The first edge contact pad 111*b* may be used as a dummy contact pad. Since the top area of each first edge contact pad 111*b* is larger than the top area of each primary contact pad 131*a*, the size of electronic structure connected later on the first edge contact pad 111*b* may be relatively larger than the size of electronic structure connected on the primary contact pad 131*a* (as shown in FIG. 24, the size of capacitor 705*b* is larger than the size of capacitor 705*a*). Accordingly, when corresponding electronic structures are connected respectively on the primary contact pad 131*a* and the first edge contact pad 111*b*, the relative size increasing of the electronic structure connected on the first edge contact pad 111*b* may be used to improve the dense/isolated loading effect of the circuit patterns between the core region I and the peripheral region II, thereby improving the uniformity of electronic structures connected on all primary contact pads 131*a* in the core region I, as well as avoiding anomaly of the electronic structures connected on the primary contact pads 131*a* (i.e. the primary contact pads 131*a* adjacent to the first edge contact pads 111*b*) in the boundary of core region I and improving the performance of resultant semiconductor devices. In addition, it should be noted that, in other embodiment of present invention, all first edge contact pads 111*b* may be as a whole positioned on the border region III. In the case that at least parts of the first edge contact pads 111*b* are formed on the border region III, for one thing, the required area of core region I for the first edge contact pad 111*b* and the electronic structure connected thereon may be decreased as much as possible to improve the valid area utilization of the core region, thereby improving the device density. For another thing, the size of first edge contact pads 111*b* and the electronic structure connected thereon may be increased as much as possible to achieve better results in the aspect of improving the uniformity of electronic structures connected on all primary contact pads 131*a* in the core region I.

It should be noted that, in the case that the contact pads in the embodiment of present invention are manufactured based on the contact pad layout shown in FIG. 13, the number of first edge contact pad 111*b* is plural and the first edge contact pad 111*b* are aligned in two columns along the extending direction of the edge of primary contact 131*a* region (i.e. the region inside the boundary of the core region I, which may be also referred as the central region or inner region of the core region I). The first edge contact pads 111*b* are arranged aligning with corresponding primary contact pads 131*a*. The spacing between the column of first edge contact pads 111*b* closest to the primary contact pad 131*a* region (i.e. the first edge contact pad 111*b* formed based on the first edge contact pad 112) and one adjacent column of the primary contact pad 131*a* is the first edge spacing D1, while in the case that the contact pads in the embodiment of present invention are manufactured based on the contact pad layout shown in FIG. 14 or FIG. 15, the first edge contact pads 111*b* include a strip with zigzag edge (not shown), which corresponds to the first edge contact pad patterns 111 in FIG. 14 or FIG. 15. Optionally, the zigzag edge faces the arrangement region of primary contact pads 131*a*. The teeth of zigzag edge of the strip are aligned with corresponding primary contact pad 131a. The spacing between the teeth of the strip and the closest aligning primary contact pads 131a is the first edge spacing D1.

In addition, optionally, please refer to FIGS. 13-15. The contact pads in the embodiments of present invention may further include multiple second edge contact pads (not shown). The second edge contact pads are manufactured based on the second edge contact pad patterns 121, 122 in the second edge layout region 12. The second edge contact pads are disposed outside one edge adjacent to the edge of all primary contact pad region, and the top area of each second edge contact pad is larger than the top area of each primary contact pad (more specifically, the cross-sectional area of each second edge contact pad is larger than the cross-sectional area of each primary contact pad), the second edge contact pads adjacent to the primary contact pads (i.e. the second edge contact pads formed based on the second edge contact pad patterns 121) and the primary contact pads have a second edge spacing D2 therebetween. The shape of second edge contact pad is different form the shape of first edge contact pad, and the second edge spacing D2 is different form the fourth spacing D4. Optionally, the second edge contact pads are aligned with corresponding primary contact pads. For example, all of the second edge contact pads are aligned in two columns along the extending direction of the adjacent edge, and the spacing between the row of the second edge contact pads closest to the primary contact pad region and one adjacent row of the primary contact pads is the second edge spacing D2. Two rows of the second edge contact pads have a third spacing D3 therebetween, and the third spacing D3 is larger than the second edge spacing D2. Optionally, in all of the second edge contact pads, the cross-sectional shape (or top shape) of second edge contact pad in the row farther from the primary contact pad region includes at least two shapes selected from rectangle, left-turned U-shape, right-turned U-shape, left-turned L-shape, right-turned L-shape and comb shape with at least two teeth.

Figure 16A:
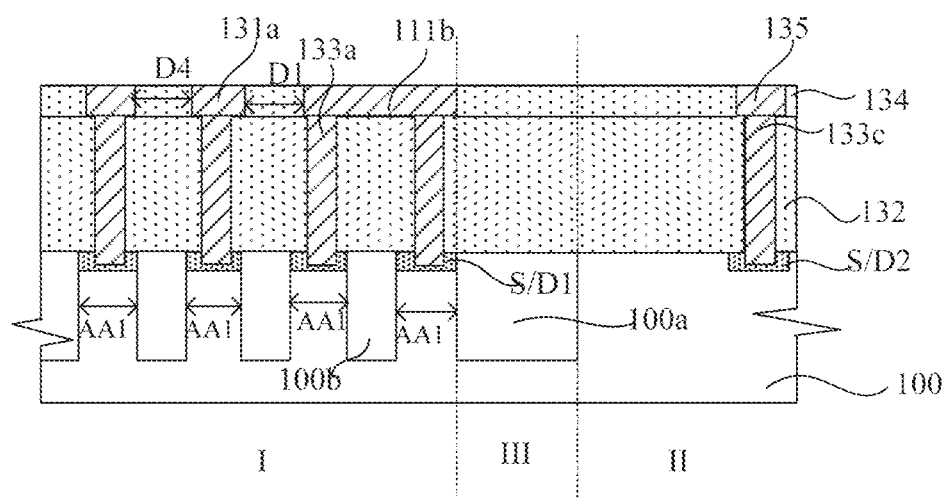
FIG. 16A is a schematic view of a contact pad layout in an embodiment of the present invention.
Figure 16B:
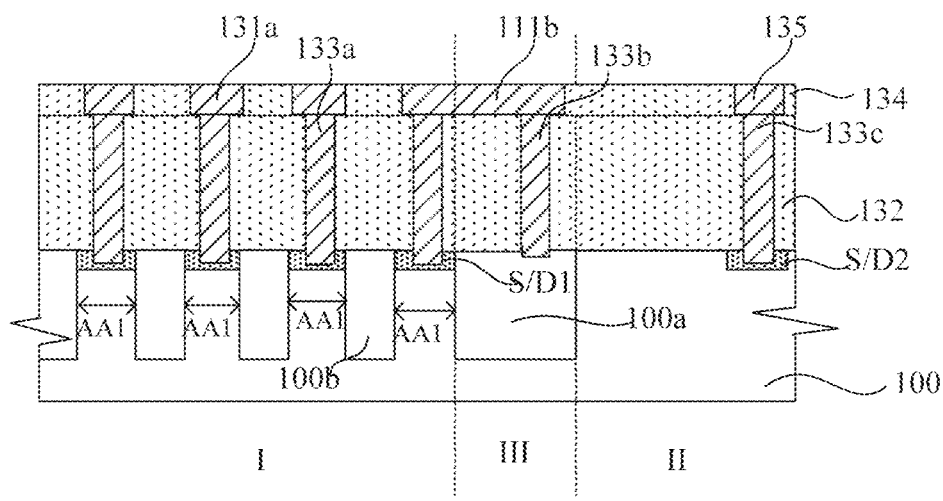
FIG. 16B is a schematic view of a contact pad layout in another embodiment of the present invention.

In addition, please refer to FIG. 16A and FIG. 16B. For the contact pads of semiconductor device in the embodiments of present invention, the primary contact pads 131a, the first edge contact pads 111b and the second edge contact pads may be formed simultaneously with the contact pads 135 in the peripheral region II. The primary contact pad 131a is connected with a corresponding active area AA1 (i.e. corresponding source or drain S/D1) in the core region I through a corresponding contact plug 133a. The first edge contact pad 111b and the second edge contact pad are connected with a corresponding active area AA1 (i.e. corresponding source or drain S/D1) in the boundary of core region I or are connected with a shallow trench isolation 100a in the border region III through a corresponding contact plug 133b. The contact pad 135 is connected with a corresponding source or drain S/D2 in the peripheral region II through a contact plug 133c, wherein the contact pads are formed in the same filling process, while the contact pads and the connected contact plugs may be manufactured separately and individually or may be formed in the same metal filling process. In the case that the contact pads and the connected contact plugs are separately and individually manufactured, an interlayer dielectric layer 132 may be first deposited and etched to form contact holes. The contact holes are filled with metal and planarized to form contact plugs 133a, 133b, 133c. An interlayer dielectric layer 134 is then deposited and etched to form recesses. The recesses are filled with metal and planarized to form the primary contact pads 131a, the first edge contact pads 111b, the second edge contact pads and the contact pads 135. In the case that the contact pads and the connected contact plugs are formed in the same metal filling process, an interlayer dielectric layer with larger thickness (ex. the thickness equal to the sum of thicknesses of interlayer dielectric layer 132 and interlayer dielectric layer 134) may be deposited in one process, and channels connecting the contact pads and the connected contact plugs are then formed through corresponding etching process. Thereafter, the channels are filled with metal and planarized to form the contact plugs 133a, 133b, 133c, the primary contact pads 131a, the first edge contact pad 111b, the second edge contact pad and the contact pad 135 simultaneously. At this time, the primary contact pad 131a and the connected contact plug 133a are integrally formed, the first edge contact pad 111b and the connected contact plug 133b are integrally formed, the second edge contact pad and the connected contact plug 133b are integrally formed, and the second edge contact pad 135 and the connected contact plug 133c are integrally formed.

Please refer to FIGS. 13-15 and FIGS. 16A-16B. Based on the same invention concept, one embodiment of the present invention further provide a semiconductor device, including a semiconductor substrate 100, an interlayer dielectric layer and the contact pads of semiconductor device as described in the present invention, wherein the semiconductor substrate is provided with a core region I, a peripheral region II and a border region III between the core region I and the peripheral region II. Multiple core components are formed in the core region I. The core components are formed on corresponding active areas AA1 and shallow trench isolations (STI) 100b are formed between adjacent active areas AA1. The core component may be MOS transistor with a buried gate formed in the corresponding active area AA1 and source or drain S/D1 at two sides of the buried gate. The interlayer dielectric layer is provided with an interlayer dielectric layer 132 and an interlayer dielectric layer 134 sequentially covering on the semiconductor substrate 100. The shallow trench isolations (STIs) 100a are formed in the border region III to be used to isolate the core region I and the peripheral region II. The contact pad is formed in the interlayer dielectric layer 134 and at least includes a primary contact pad 131a and a first edge contact 111b, and may further include a second edge contact pad. The semiconductor devices may further include contact plugs connected under the contact pad and electronic structures (ex. capacitors or resistors) connected on the contact pads. The contact plugs 133a, 133b, 133c are formed in the interlayer dielectric layer 132. The contact pads 133a are aligned with the bottoms of corresponding primary contact pads 131a and corresponding active areas AA1 (i.e. corresponding sources and drains S/D1) of the core components to electrically connect the corresponding primary contact pads 131a and the corresponding active areas AA1 of the core components. The tops of contact plugs 133b are aligned with the bottoms of corresponding first edge contact pads 111b or second edge contact pads. The bottoms of contact plugs 133b are aligned with the active areas AA1 in the boundary of core region I (i.e. corresponding sources or drains S/D1) or the STIs 100a in the border region III to connect corresponding first edge contact pads 111b or second edge contact pads with the active areas AA1 in the boundary of the core region I or the STIs 100a in the border region III.

Figure 17A:
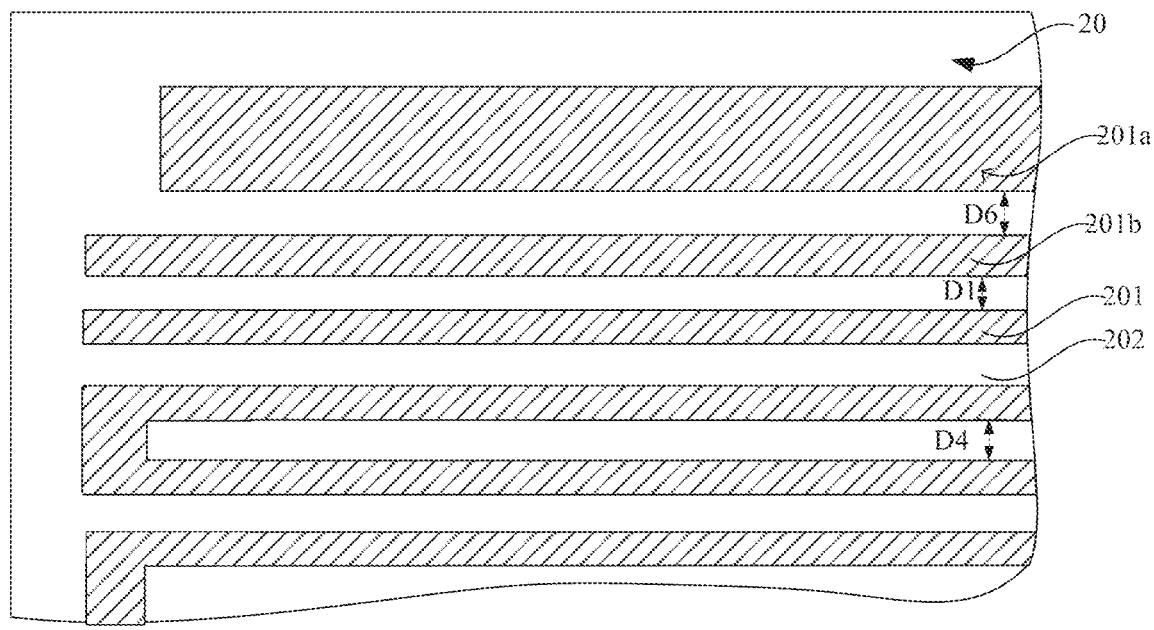
FIG. 17A is a schematic view of a first mask in a mask combination in an embodiment of the present invention.
Figure 17B:
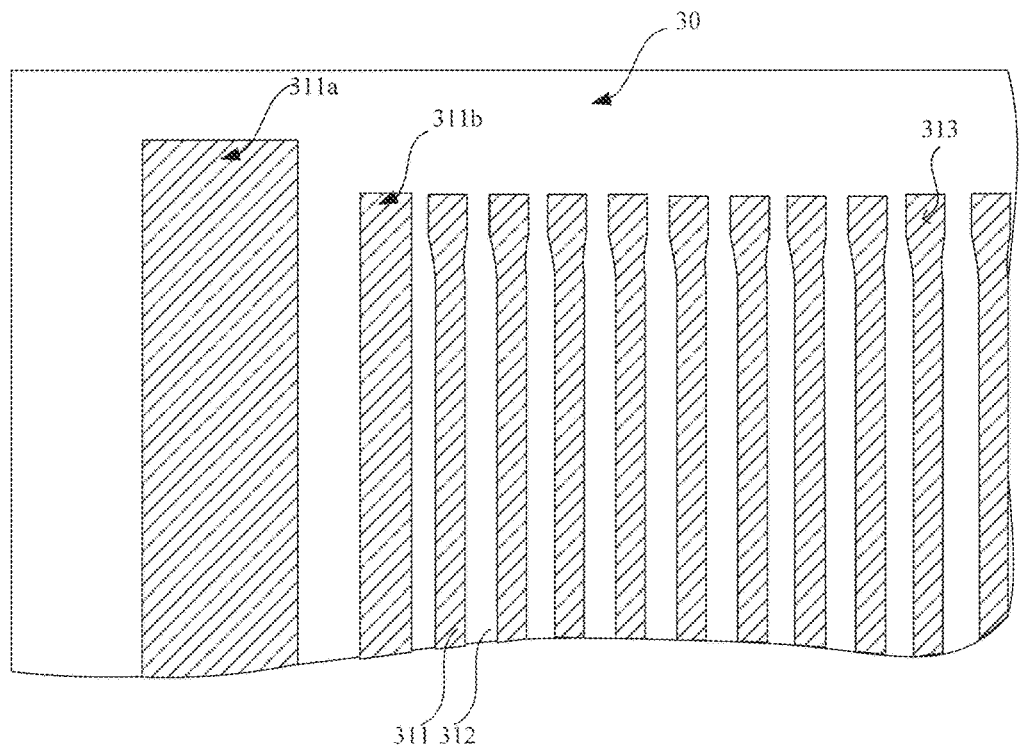
FIG. 17B is a schematic view of a second mask in a mask combination in an embodiment of the present invention.

Please refer to FIG. 17A and FIG. 17B. Based on the same invention concept, the present invention further provides a mask combination used to manufacture the contact structure of semiconductor device described in the present invention, including: a first mask 20 and a second mask 30, wherein the first mask 20 is provided with multiple parallel first lines 201, a first spacing region 202 between two adjacent first lines 201. The width of at least one outermost first line 201 of the first mask 20 is larger than other first lines 201, and the width of at least one outermost first spacing region 202 of the first mask 20 is larger than the width of other first spacing regions 202. For example, the width of two outermost first lines 201 (i.e. the outermost first lines 201a and the second outermost first line 201b) of the first mask 20 is larger than other first lines 201. The width of first line 201a is larger than the wide of first line 201b. The width D6 of first spacing region 202 between the first lines 201a, 201b is larger than the width of other first spacing regions 202, and the width D1 of first spacing region 202 between the first line 201b and another adjacent first line 201 is different from the width D4 of other first spacing region 202 (i.e. aside from the first spacing region 202 between the first lines 201a, 201b). The second mask 30 is provided with multiple parallel second lines 311 perpendicular to the first lines 201. A second spacing region 312 is between adjacent two second lines 311, and the width of at least one outermost second line 311 of the second mask is larger than the width of other second lines 311. The width of at least one outermost second spacing region 312 of the second mask 30 is larger than the width of other second spacing region 312. For example, the width of two outermost second lines of the second mask 30 (i.e. the outermost second line 311a and the second outermost second line 311b) is larger than the width of other second lines 311. The width of second line 311a is larger than the width of second line 311b. The width of second spacing region 312 between the second lines 311a, 311b is larger than the width of other second spacing regions 312, and the width of second spacing region 312 between the second line 311b and another adjacent second line 311 is different from other second spacing regions 302 (i.e. aside from the second spacing region 302 between the second lines 301a, 301b). Optionally, in the second mask 30, the widths of the ends 313 of all second lines 311 aside from the first one of second line 311a and the second one of second line 311b are larger than the width of middle region of the second lines 311.

Figure 18:
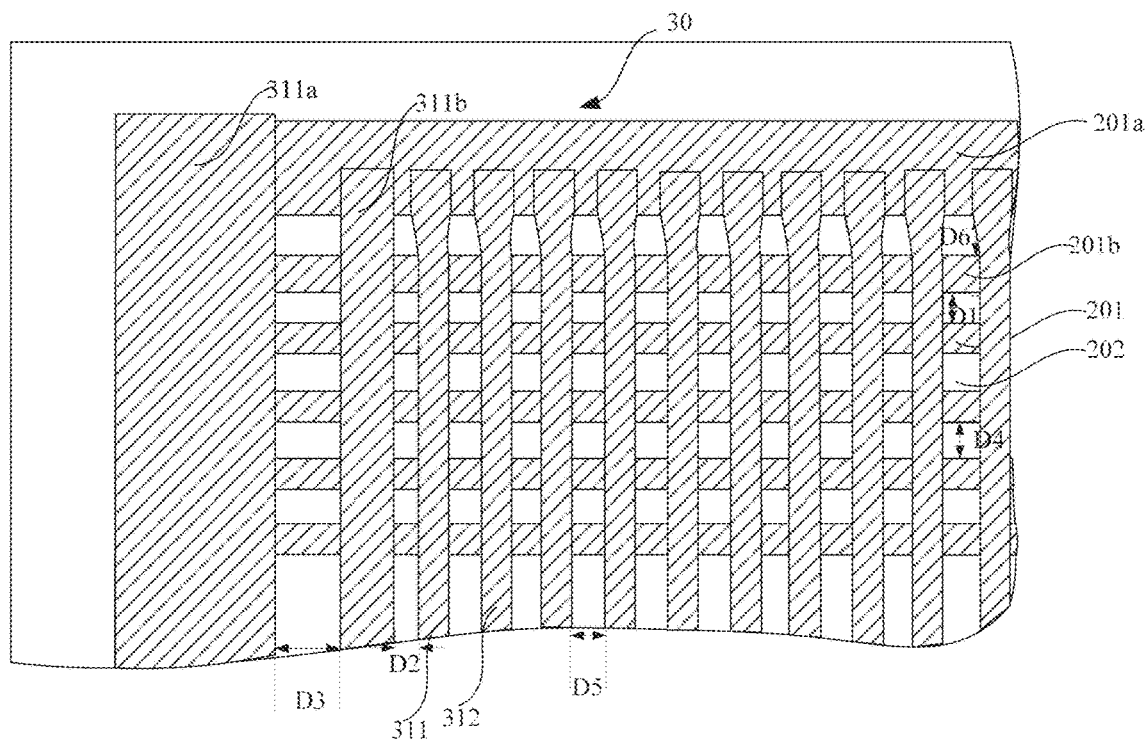
FIG. 18 is a schematic view of the two overlapping masks in the case that the first mask and the second mask in the mask combination are both positive masks in an embodiment of the present invention.

Among them, please refer to FIG. 18, when the first mask 20 and the second mask 30 are homogeneous masks and the second mask 30 aligns and overlays with the first mask 20, the overlapping region of first lines 201 and second line 311 are the regions where contact pads formed. Therefore, the overlapping regions of first line 201a and all second lines 311 aside from the second lines 311a, 311b define the first edge contact pad patterns 111 in the first edge layout region 11 in FIG. 13. The overlapping regions of first line 201b and all second lines 311 aside from the second lines 311a, 311b define the first edge contact pad patterns 112 in the first edge layout region 11 in FIG. 13. The overlapping regions of second lines 311a and all first lines 201 aside from the first lines 201a, 201b define the second edge contact pad patterns 122 in the second edge layout region 12 in FIG. 13. The overlapping regions of second lines 311b and all first lines 201 aside from the first line 201a and 201b define the second edge contact pad patterns 121 in the second edge layout region 12 in FIG. 13. The overlapping regions of all first lines 201 aside from the first lines 201a, 201b and all second lines 311 aside from the second lines 311a, 311b define the primary layout region 10 and the primary contact pad patterns 111 therein in FIG. 13. The first spacing region 202 between the first line 201b and adjacent first line 201 at inner side defines the first edge spacing D1 between the first edge layout region 11 and the primary layout region 10. The width of first spacing region 202 between the first line 201b and adjacent first line 201a at outer side defines the sixth spacing D6 between two columns of the first edge contact pad patterns 111, 112 in the first edge layout region 11, while other first spacing region 202 define the fourth spacing D4 between two columns of the primary contact pad patterns. The second spacing region 312 between the second line 311b and adjacent second line 311 at inner side defines the second edge spacing D2 between the second edge layout region 12 and the primary layout region 10. The width of second spacing region 312 between the second line 311b and adjacent second line 311a at outer side defines the third spacing D3 between two row of the second edge contact pad patterns 121, 122 in the second edge layout region 12, while other second spacing region 312 defines the fifth spacing D5 between two rows of the primary contact pad patterns. The meaning that the first mask 20 and the second mask 30 are homogenous mask is: the patterns of two masks have the same development property, which both retains the portion corresponding to its lines or both retains the portion corresponding to its spacing regions. For example, in the case that the two masks are both negative mask, the corresponding portions of first spacing region and the second spacing region will be correspondingly retained as a mask to etch underlying layers after the photolithography process using the first mask 20 and the second mask 30. In the case that the two masks are both positive mask, the corresponding portions of first lines and second lines will be correspondingly retained as a mask to etch underlying layers after the photolithography process using the first mask 20 and the second mask 30.

Figure 19:
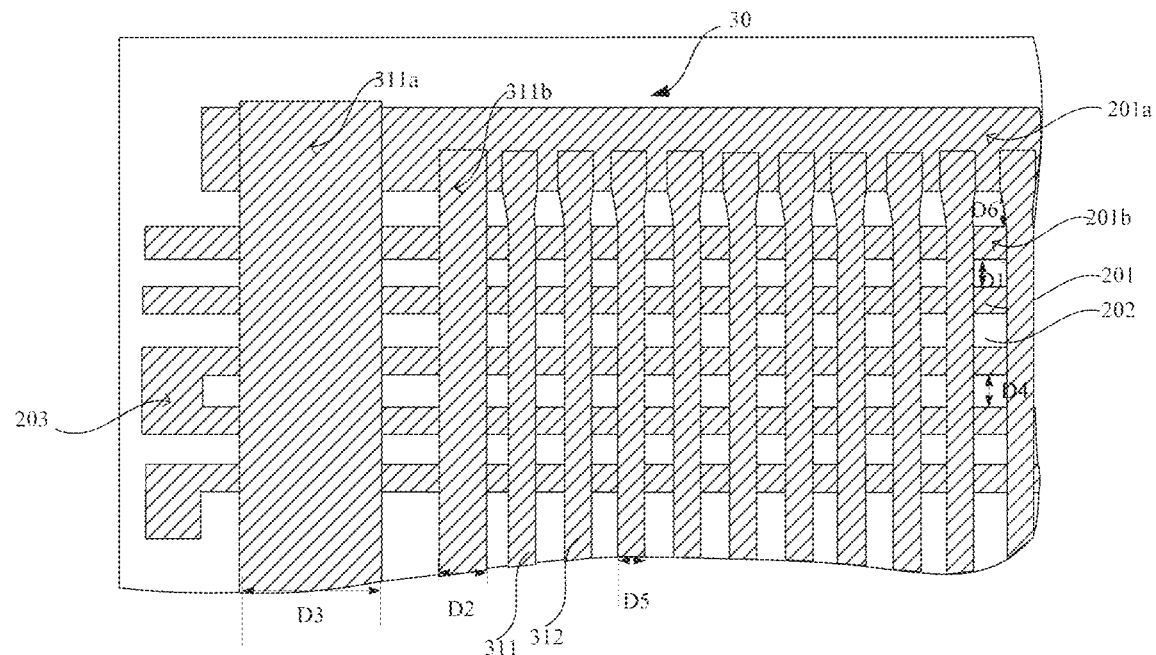
FIG. 19 is a schematic view of the two overlapping masks in the case that the first mask is positive mask and the second mask is negative mask in the mask combination in an embodiment of the present invention.

Please refer to FIG. 19. In the case that the first mask 20 and the second mask 30 are heterogeneous masks and the second mask 30 aligns and overlays the first mask 20, the overlapping regions of first lines 201 and second spacing regions 312 are the regions where contact pads formed. Accordingly, the overlapping regions of first lines 201a and second spacing regions 312 define the first edge contact pad patterns 111 in the first edge layout region 11 in FIG. 15. The overlapping regions of first lines 201b and second spacing region 312 define the first edge contact pad patterns 112 in the first edge layout region 11 in FIG. 15. The second lines 311a define the third spacing D3 in the second edge layout region 12 in FIG. 15. The second lines 311a define the second edge spacing D2 between the second edge layout region 12 and the primary region 10 in FIG. 15. The ends 203 of first lines 201 exposed outside the second lines 311a define the second edge contact pad patterns 122 in the second edge layout region 12 in FIG. 15. The portions of first lines 201 exposed in the second spacing region 312 between the second lines 311a and the second lines 311b define the second edge contact pad patterns 121 in the second edge layout region 12 in FIG. 15, while other portions of the first lines 201 exposed in the second spacing region 312 define the primary contact pad patterns 131 in the primary layout region 10 in FIG. 15. The second lines 311 aside from the second lines 311b and the second lines 311a define the fifth spacing D5 between two rows of the primary contact pad patterns 131 in the primary layout region 10 in FIG. 15. The first lines 201 aside from the first lines 201b and the first line 201a define the fourth spacing D4 between two columns of the primary contact pad patterns 131 in the primary layout region 10 in FIG. 15. The meaning that the first mask 20 and the second mask 30 are heterogeneous masks is: the patterns of two masks have opposite development properties, wherein one retains the portions corresponding to lines, and another retains the portions corresponding to the spacing regions. For example, in the case that the first mask 20 is negative mask and the second mask 30 is positive mask, the portions of first spacing regions will be correspondingly retained as a mask to etch underlying layers after the photolithography process using the first mask 20, and the portions of second lines are correspondingly retained as a mask to etch underlying layers after the photolithography process using the second mask 30. In the case that the first mask 20 is positive mask and the second mask 30 is negative mask, the portions of first lines are correspondingly retained as a mask to etch underlying layers after the photolithography process using the first mask 20, and the portions of second spacing regions are correspondingly retained as a mask to etch underlying layers after the photolithography process using the second mask 30.

Please refer to FIG. 17A and FIG. 19. Optionally, the ends of at least two first lines are connected together at one side of the first mask 20. Accordingly, the shape of second edge contact pad patterns in outermost row of the second edge layout region may not be identical and may include at least two shapes selected from rectangle, left-turned U-shape, right-turned U-shape, left-turned L-shape, right-turned L-shape and comb shape with at least two teeth.

Please refer to FIG. 18 and FIG. 19. Optionally, in the case that the second mask 30 and the first mask 20 are aligned and overlapped, the ends of all second lines 311 aside from the outermost second line 311a of the second mask 30 (including the second outermost second line 311b) do not extend beyond the outermost first line 201a of first mask 20. Please refer to FIG. 19. In the case that the first mask 20 and the second In the case that 30 are heterogeneous masks and the second In the case that 30 and the first In the case that 20 are aligned and overlapped, the outermost second line 311 of second In the case that 30 exposes the end 203 of at least one first line 201.

Please note that, in the embodiments of present invention, the first mask 20 and the second mask 30 may be respectively the mask capable of transferring the patterns of first lines, first spacing regions, second lines and second spacing regions onto the layer used to form the contact pads through only one photolithography process. Alternatively, it may need double patterning or multiple patterning processes to form required patterns of first lines and first spacing regions and required patterns of second lines and second spacing regions in some auxiliary layers (ex. the hard mask layer on the layer used to form the contact pads). In this case, the auxiliary layer with the patterns of first lines and first spacing layer is first mask 20, while the auxiliary layer with the patterns of second lines and second spacing layer is second mask 30. Certainly, in some embodiments of the present invention, it may also use double pattering or multiple patterning process to form aligning and overlapping patterns of the first lines, first spacing regions, second lines and second spacing regions in the same auxiliary layer (ex. the hard mask layer on the layer used to form the contact pads). At this time, the auxiliary layer may be considered as a mask combination formed by aligning and overlapping the first mask 20 and the second mask 30. In order to provide a further understanding of how to form the first mask 20 or the second mask 30 through double patterning or multiple patterning process, detailed description will be made hereinafter with reference to FIGS. 20A-20D and FIGS. 21A-21D.

Figure 20A:
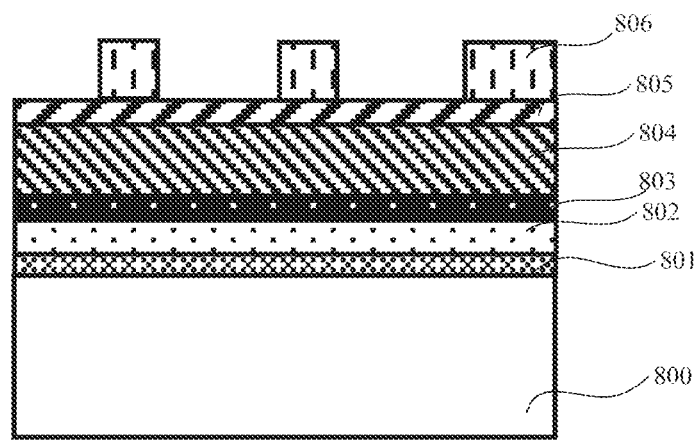
FIGS. 20A-20D are schematic view illustrating a procedure of transferring patterns in the first mask or the second mask to a layer to be etched later in an embodiment of the present invention.

Please refer to FIG. 20A-20D. In one embodiment of the present invention, explicit steps of forming first mask 20 and second mask 30 through double patterning process include:

Firstly, please refer to FIG. 20A. Provide a semiconductor substrate 800 and sequentially form an etch stop layer 801 (ex. silicon oxide), an interlayer dielectric layer 802 (the layer used to form contact pads), a hard mask layer 803 (ex. silicon nitride), a first auxiliary layer 804 (ex. organic dielectric layer), a bottom anti-reflective coating 805 and a photoresist layer 806. The corresponding pattern may be formed in the patterned photoresist layer 806 through single photolithography process.

Figure 20B:
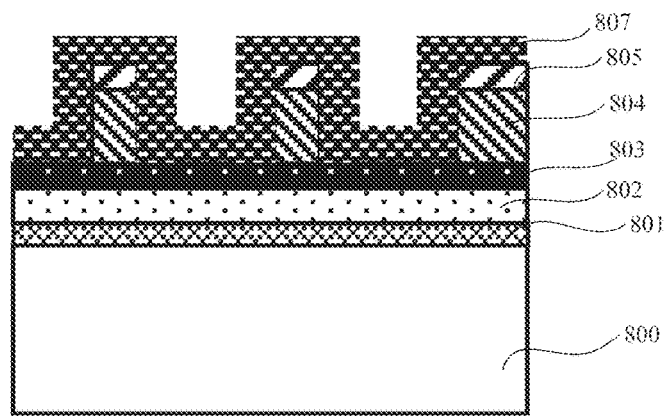

Thereafter, please refer to FIG. 20B. Use the patterned photoresist layer 806 as a mask to etch the bottom anti-reflective coating 805 and the first auxiliary layer 804 until the top surface of hard mask layer 803 exposed, thereby transferring the pattern in patterned photoresist layer 806 to the first auxiliary layer 804. Remaining bottom anti-reflective coating 805 and first auxiliary layer 804 form multiple mandrels. The patterned photoresist layer 806 is then removed.

Figure 20C:
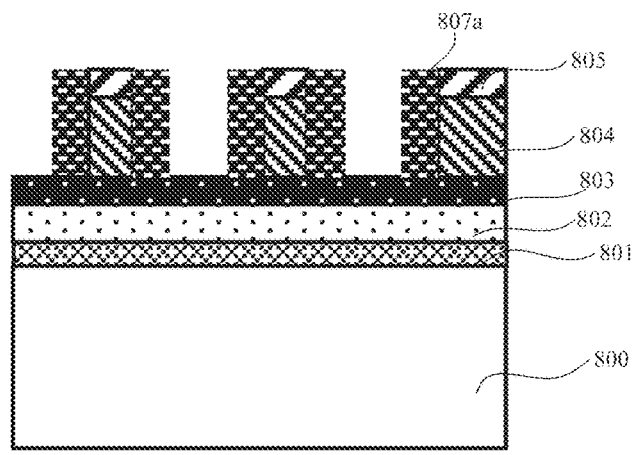

Afterward, please refer to FIG. 20B and FIG. 20C. Cover a second auxiliary layer 807 on the bottom anti-reflective coating 805, the first auxiliary layer 804 and the hard mask 803, and the second auxiliary layer 807 is etched to form spacers 807a on sidewalls of the mandrels (i.e. the bottom anti-reflective coating 805 and the first auxiliary layer 804). The mandrels (i.e. the bottom anti-reflective coating 805 and the first auxiliary layer 804) are then removed. At this time, the layer formed by all spacers 807a and the spacings therebetween is the first mask 20 or the second mask 30. For example, in the case of first mask 20, the spacers 807a are first spacing regions 202 in the first mask 20, while the spacings between adjacent spacers 807a are first lines 201 in the first mask 20.

Figure 20D:
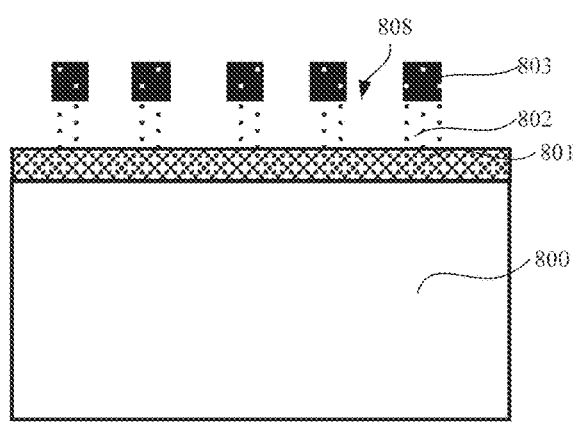

Thereafter, please refer to FIG. 20C and FIG. 20D. Use the spacers 807a as a mask to etch the hard mask 803 and interlayer dielectric layer 802, thereby forming recesses extending along the first direction (i.e. corresponding to the first lines 201 in the first mask 20) at spacing positions between corresponding spacers 807a in the interlayer dielectric layer 802.

Please note that, in the case that the first mask 20 and the second mask 30 are both formed by the method shown in FIGS. 20A-20D, recesses extending along the first direction (i.e. corresponding to the first lines 201 in the first mask 20) and recesses extending along a second direction (i.e. corresponding to the second lines 311 in the second mask 30) perpendicular to the first direction are formed in the interlayer dielectric layer 802. The crossing points of recesses in the two directions are positions at which the contact pads formed.

Figure 21A:
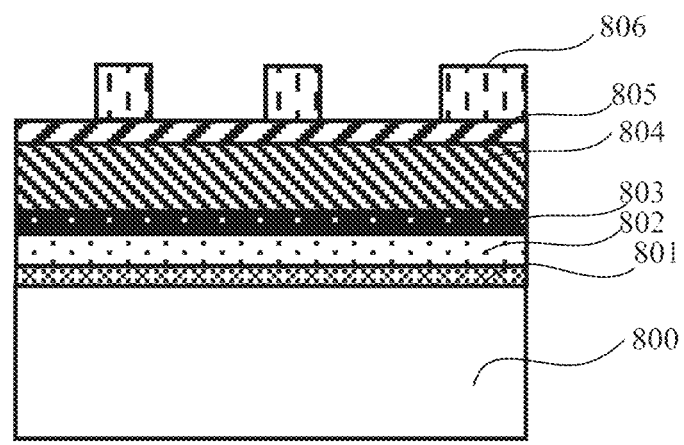
FIGS. 21A-21D are schematic view illustrating a procedure of transferring patterns in the first mask or the second mask to a layer to be etched later in another embodiment of the present invention.

Please refer to FIGS. 21A-21D. In another embodiment of present invention, explicit steps of forming first mask 20 or second mask 30 through double patterning process include:

Firstly, please refer to FIG. 21A. Provide a semiconductor substrate 800 and sequentially form an etch stop layer 801 (ex. silicon oxide), an interlayer dielectric layer 802 (the layer used to form contact pads), a hard mask layer 803 (ex. silicon nitride), a first auxiliary layer 804 (ex. organic dielectric layer), a bottom anti-reflective coating 805 and a photoresist layer 806. The corresponding pattern in the patterned photoresist layer 806 may be formed through single photolithography process.

Figure 21B:
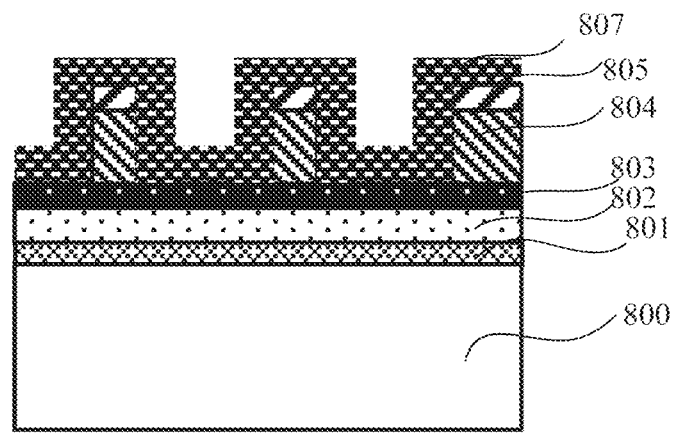

Thereafter, please refer to FIG. 21B. Use the patterned photoresist layer 806 as a mask to etch the bottom anti-reflective coating 805 and the first auxiliary layer 804 until the top surface of hard mask layer 803 exposed, thereby transferring the pattern in patterned photoresist layer 806 to the first auxiliary layer 804. Remaining bottom anti-reflective coating 805 and first auxiliary layer 804 form multiple mandrels. The patterned photoresist 806 is then removed.

Figure 21C:
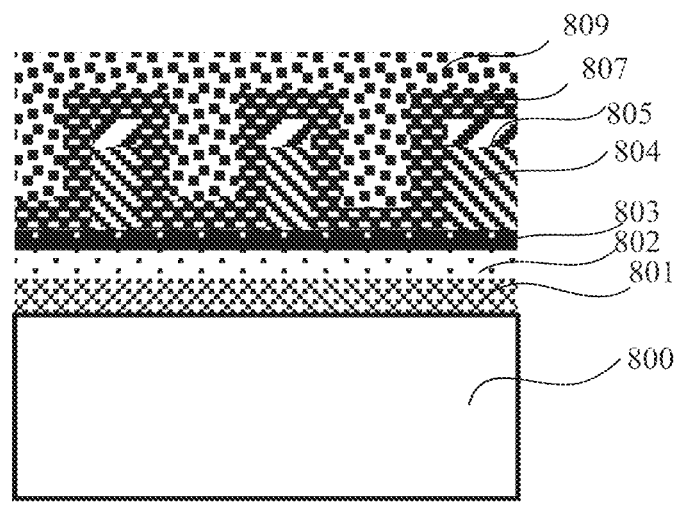
Figure 21D:
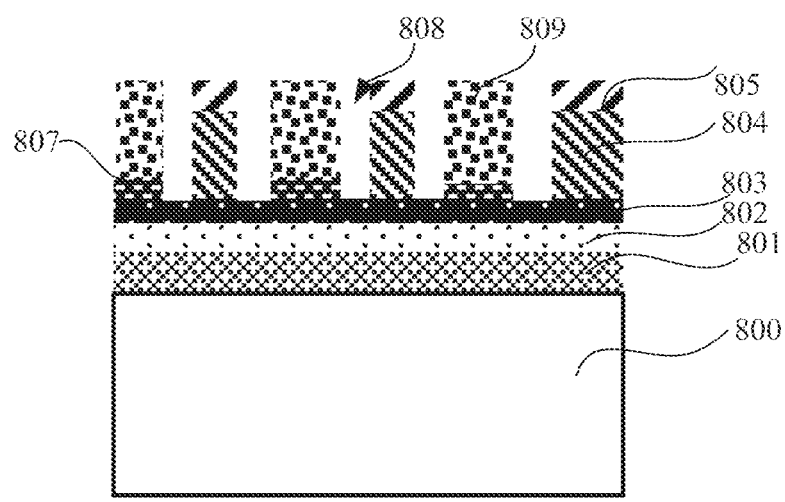

Afterward, please refer to FIG. 21B and FIG. 21C. Cover a second auxiliary layer 807 and a third auxiliary layer 809 sequentially on the bottom anti-reflective coating 805, the first auxiliary layer 804 and the hard mask 803. The top of third auxiliary layer 809 is planarized until the top surface of bottom anti-reflective coating 805 is exposed, and the second auxiliary layer 807 on sidewalls of the mandrels (i.e. the bottom anti-reflective coating 805 and the first auxiliary layer 804) are etched and removed to form openings 808. At this time, the layer constituted by remaining second auxiliary layer 807, third auxiliary layer 809, bottom anti-reflective coating 805, first auxiliary layer 804 and the openings 808 is the first mask 20 or the second mask 30. For example, in the case of first mask 20, the opening 808 is the first line 201 in the first mask 20. The stacked structure formed by the second auxiliary layer 807 and the third auxiliary layer 809 at every side of the openings 808 or the stacked structure formed by the bottom anti-reflective coating 805 and the first auxiliary layer 804 are the first spacing region 202 in the first mask 20.

Thereafter, the same method may be used to manufacture the second mask 30 on an already formed first mask 20 or to manufacture the first mask 20 on an already formed second mask 30, thereby forming the first mask 20 and the second mask 30 that align and overlap each other, i.e. mask combination. The mask combination is further used as a mask to etch the hard mask 803 and the interlayer dielectric layer 802, to form the recesses used in the manufacture of contact pads in the interlayer dielectric layer 802.

In following embodiment, the dynamic random access is taken as the semiconductor device to specify a method of manufacturing the semiconductor device of contact pad layout in the embodiment.

Figure 22:
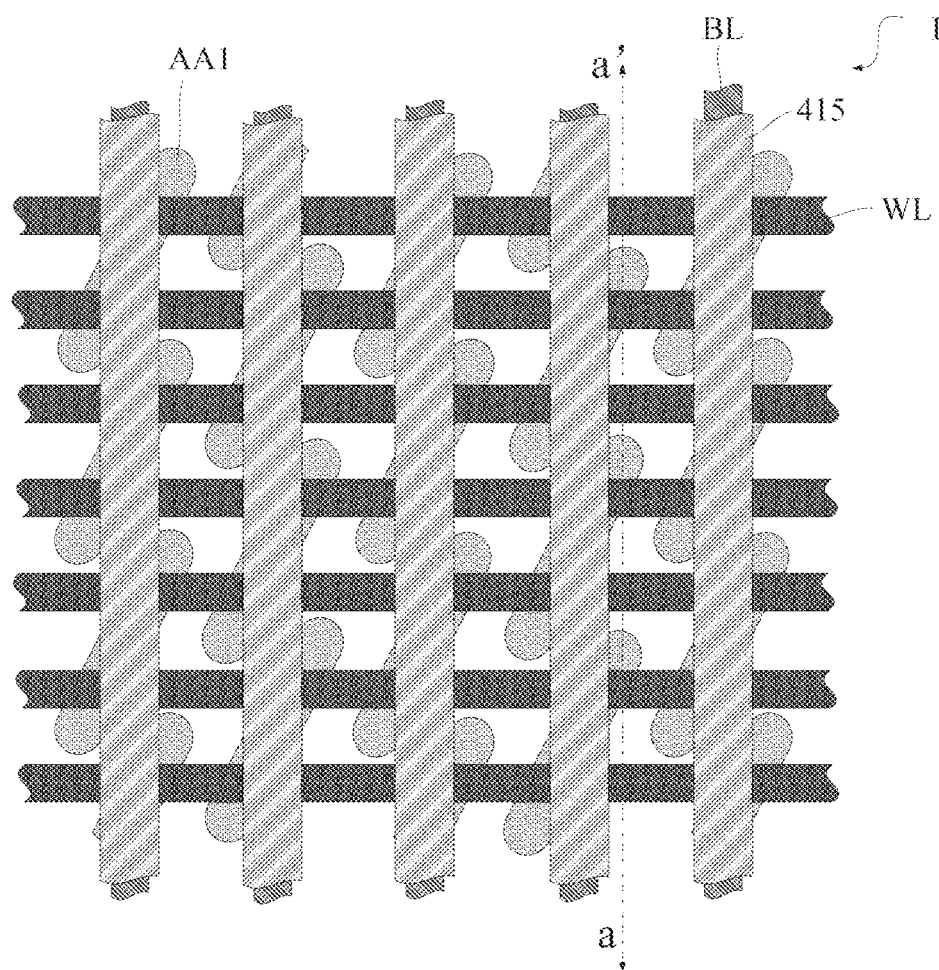
FIG. 22 is a schematic plan view in the method of manufacturing a semiconductor device in an embodiment of the present invention.
Figure 23:
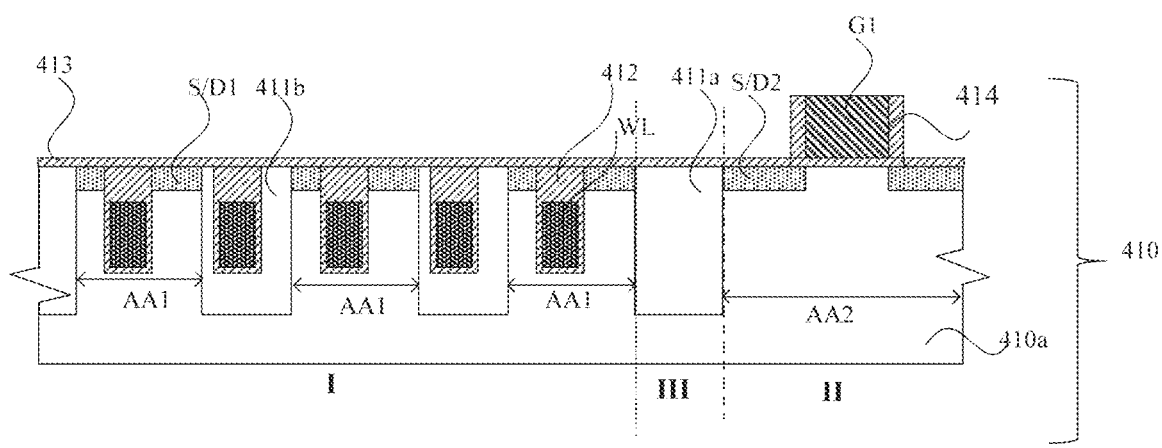
FIGS. 23-25 are schematic cross-sections taken along a section line a-a' in FIG. 21A in the method of manufacturing a contact structure of semiconductor device in an embodiment of the present invention.

Firstly, please refer to FIG. 22 and FIG. 23. Provide a semiconductor substrate 410 with multiple core components (i.e. storage transistors). Explicit procedure may include: firstly, provide a semiconductor substrate 410a with a core region I, a peripheral region II and border region III. In the embodiment, the core region I is a storage region. The core component to be formed on the core region I includes selector. Data storage component is then connected on the core component. The selector may be, for example, MOS transistor or diode. The data storage component may be, for example, capacitor or variable resistor, etc. One selector and one corresponding data storage component constitute a memory cell. Peripheral circuit TR (ex. NMOS transistor, PMOS transistor, diode or resistor) may be formed in the peripheral region II to control memory cells. Multiple shallow trench isolations 411b are formed in the core region I of semiconductor substrate 410a, and shallow trench isolations 411a are formed in the semiconductor substrate 410a in the border region III. The shallow trench isolations 411a demarcate the border of core region I and peripheral region II on a two-dimensional plane, while the shallow trench isolations 411b demarcate the active areas AA1 corresponding to the core components in the core region I, wherein the active area AA1 is in a strip shape extending along a first direction on the two-dimensional plane, and the active area AA1 may be in stagger arrangement on the surface of the semiconductor substrate 410a. Thereafter, buried word lines WL are formed in the semiconductor substrate 410a. The buried word line WL is generally buried in a predetermined depth in the semiconductor substrate 410a, extending along a second direction (ex. column direction) through the shallow trench isolations 411b and the active areas AA1. The second direction intersects but not perpendicular to the first direction of the active area AA1. The buried word line WL functions as a switch to control the memory cells. The sidewalls and bottoms of buried word line WL are usually surrounded by a gate dielectric layer (not shown), and the tops of buried word line WL are buried within a gate capping layer 412. Since the buried word line WL is not essential feature of the present invention, relevant manufacturing process may be referred to conventional technical schemes in the art and will not be herein specified. In addition, the gate dielectric layer may include silicon oxide or other suitable dielectric material. The buried word line WL may include Al, W, Cu, Ti—Al alloy, polysilicon or other suitable conductive material, while the gate capping layer may include silicon nitride, silicon oxynitirde, silicon carbonitride or other suitable insulation materials. Furthermore, the active areas AA1 at two sides of the buried word line WL may be doped with second type dopants, such as p-type or n-type dopant, to form sources and drains (referred collectively as S/D1). One of the active areas AA1 at two sides of the buried world line WL is positioned at the center of active area AA1 that corresponds to a predetermined bit line contact, while the other is positioned at a position of predetermined storage node contact at the end of the active areas AA1. Word lines WL and S/D1 may constitute or limit multiple MOS storage transistors on the core region I of semiconductor device. In addition, in the formation of S/D1, sources and drains (referred collectively as S/D2) corresponding to the peripheral transistors may also be formed in the peripheral region II. After the S/D1 and the S/D2 are formed, an etch stop layer 413 may be further formed on the semiconductor substrate 410a to cover the S/D1 and the S/D2, with materials, for example, including silicon nitride (SiN) and/or silicon oxide ($SiO_2$). Thereafter, form multiple bit line contact plugs (not shown) on the drains S/D1 in the core region I and form bit lines BL on the bit line contacts. The bit line contacts may be formed through following method: firstly, etch a S/D1 between two adjacent word lines to form a recess in the active area AA1, then form a metal silicide in the recess. Multiple parallel bit lines BL extend in a third direction (i.e. row direction) perpendicular to the word lines WL and, at the same time, cross over the active areas AA1 and the buried word lines WL. The bit line BL include sequentially, for example, a semiconductor layer (ex. polysilicon, not shown), a barrier layer (ex. including Ti or TiN, not shown), a metal layer (ex. W, Al or Cu, not shown) and a mask layer (ex. including silicon oxide, silicon nitride or silicon carbonitride, not shown). In addition, at least one gate structure G1 is formed on the peripheral region II of semiconductor substrate 410a, for example, including a gate dielectric layer (not shown) and a gate electrode layer (not shown) sequentially stacked. In an embodiment, the gate electrode layer of gate structure G1 and the semiconductor layer or metal layer of the bit line BL are formed simultaneously. Furthermore, various processes or single process may be used to form spacers 414 respectively surrounding the bit lines BL and the gate structures G1. For example, a process may be performed first to manufacture the spacers of gate structure G1, so that the spacers 414 of gate structure G1 include silicon oxide or silicon oxynitride (SiON), then perform the process to manufacture the spacers of bit lines BL, so that the spacers of bit lines BL may include silicon nitride. In addition, in the process of manufacturing the spacers of gate structure G1, an etching back process may be further performed to lower the overall height of gate structure G1 than the height of bit lines BL.

Thereafter, the contact pad layout shown in FIGS. 13-15 or the mask combination shown in FIGS. 17-19 of the present invention may be used to form storage node contacts, with following explicit procedure:

Firstly, please refer to FIG. 24 or 25. After a semiconductor substrate 410 with the bit lines BL and sources and drains S/D1 of the core components is provided, an interlayer dielectric layer 500 is formed on the semiconductor substrate 410, with materials like silicon oxide, silicon nitride or low-k dielectrics. Specifically, the interlayer dielectric layer 500 is covered on the semiconductor substrate 410 through a blanket deposition process, so that the spaces between bit lines BL are filled up and the bit lines and the gate structure G1 including the spacers 414 are also buried therein. The interlayer dielectric layer 500 is then planarized through a CMP process to form an interlayer dielectric layer 500 with an overall flat top surface, wherein the top surface of planarized interlayer dielectric layer 500 is at least not lower than the top surface of bit lines BL.

After that, please refer still to FIG. 24 or FIG. 25. The mask combination pattern (not shown) with aligning and overlapping first mask 20 and second mask 30 as shown in FIG. 18 or FIG. 19 is formed on the interlayer dielectric layer 500 through a series of corresponding processes including the deposition of auxiliary layers, photolithography process and etching. The mask combination pattern is any contact pad layout shown in FIGS. 13-15, to define the positions of storage node contacts. The mask combination pattern is then used as an etch mask to anisotropically etch the interlayer dielectric layer 500 and form contact holes (not shown) exposing the underlying corresponding sources S/D1 or form contact holes exposing the source S/D2 or the gate structures G1 in the peripheral region II through the interlayer dielectric layer 500, wherein the contact holes corresponding to the first edge contact pad patterns and the second edge contact pad patterns in corresponding contact pad layout may be formed in the boundary of core region I (at this time, the tops of contact holes are connected together and cross over at least one outermost word line WL in the boundary of core region I), and may also be formed at least partially on the STI 411a in the border region III. The contact holes corresponding to the primary contact pad patterns in the contact pad layout are formed in the core region I.

Thereafter, please refer to FIG. 24 or FIG. 25. After the contact holes are formed, an ashing process, a wet clean process or other suitable process may be performed to remove the layers on the interlayer dielectric layer 500, and a metal barrier layer (not shown) and a conductive metal layer (not shown) are sequentially filled in the contact holes. The metal barrier layer may cover inner sidewalls of the contact holes and the top surface of interlayer dielectric layer 500 in a uniform thickness to reduce or prevent the diffusion of metal materials in the contact holes into the interlayer dielectric layer 500. For example, the metal barrier layer may be formed of Ta, TaN, TaSiN, Ti, TiN, TiSiN, W, WN or any combination thereof by using CVD, ALD or PVD (ex. sputter) process, etc. The conductive metal layer may be formed of (one or more) refractory metal, such as Co, Fe, Ni, W and/or Mo. In addition, the conductive metal layer may be formed by a deposition process with good step coverage, for example, by using CVD, ALD or PVD (ex. sputter). The resultant conductive metal layer further covers on the surface of interlayer dielectric layer 500 surrounding the contact holes. Thereafter, a chemical mechanical polishing (CMP) process may be used to chemically and mechanically polish the top surface of deposited conductive metal layer until the top surface of interlayer dielectric layer 500 is exposed, thereby forming primary contact pads 511a, peripheral contact pad 511d, 511e and first edge contact pads (or second edge contact pads) 511b in the interlayer dielectric layer 500. The primary contact pad 511a serves as a storage node contact in the core region I to connect a capacitor formed later on the core region I. The first edge contact pad (or second edge contact pads) 51b is formed by at least two contact plugs with connecting tops in the boundary of core region I (as shown in FIG. 24), or formed by the contact plug in the border region III and the contact plug in the boundary of core region with connecting tops (as shown in FIG. 25), or formed by a contact plug with larger size in the border region III (not shown), to serve as a dummy storage node contact in the boundary of core region I or the border region III and used to connect the capacitor formed later on the boundary of core region I or on the border region III. The first edge contact pad (or second edge contact pad) 511b and the bit line BL are aligned in parallel. The first edge contact pad (or second edge contact pad) 511b may have a cross-section, for example, like an inverted-U contact or a comb contact. The peripheral contact pad 511d serves as a contact for the gate structure G1 in the peripheral region II to lead out the gate structure G1. The contact pad 511e serves as a contact for source or drain S/D2 in the peripheral region II to lead the source or drain S/D2 out of the peripheral region II. The primary contact pad 511a, the peripheral contact pad 511d, 511e and the first edge contact pad (or second edge contact pad) 511b may be an integrated structure or may be constituted by a pad and a contact plug connected thereunder.

Afterward, please refer still to FIG. 24 and FIG. 25. Conventional methods of manufacturing capacitors in the art may be used to manufacture corresponding capacitors on the core region I, which explicit procedure will not be repeated herein. A capacitor 705a is connected on each primary contact pad 511a in the core region I. A capacitor 705b is connected on the first edge contact pad or the second edge contact pad in the boundary of core region I and/or the border region III. Each capacitor includes a bottom electrode layer 701, a capacitor dielectric layer 702 and a top electrode layer 703. A bottom supporting layer 600, a middle supporting layer 601 and a top supporting layer 602 that can provide lateral support are stacked and spaced apart between capacitors, wherein the bottom supporting layer 600 is used, for one thing, to provide bottom support for the bottom electrode layer formed later, for another thing, to isolate internal components of the semiconductor substrate 400 and the capacitors above, etc. The process of forming bottom supporting layer 600 may further be a thermal oxidation process. The material of bottom supporting layer 600, the middle supporting layer 601 and the top supporting layer 602 includes but not limited to silicon nitride. In other embodiment of present invention, at least two middle supporting layers 601 may be stacked between the bottom supporting layer 600 and the top supporting layer 602 in order to provide better support for the bottom electrode layer. The capacitor 705b has a first width W1 and the capacitor 705a has a second width W2. Optionally, W1 is larger than W2. For example, W1=1.3*W2~2.3*W2. Optionally, all capacitors may be arranged in a hexagonal close-packing. Furthermore, the bottom electrode layer 701 may be a cylindrical structure like polysilicon electrode or metal electrode. In the case that the bottom electrode layer 701 is a metal electrode, titanium nitride (TiN) and Ti stacked structure may be further used. In the case that the bottom electrode layer 701 is a polysilicon electrode, it may be formed by undoped and/or doped polysilicon materials. The capacitor dielectric layer 702 covers the inner surface and outer surface of the cylindrical structures of bottom electrode layer 701 to complete utilize two opposite surfaces of the bottom electrode layer 701 and constitute capacitors with larger electrode surface area. Preferably, the capacitor dielectric layer 702 may be a high-k dielectric layer like metal oxide. Furthermore, the capacitor dielectric layer 702 may be a multilayer structure, such as a two-layer structure of hafnium oxide-zirconium oxide. The top electrode layer 703 may be a monolayer structure or a multilayer structure. In the case that the top electrode layer 703 is a monolayer structure, it may be, for example, a polysilicon electrode or a metal electrode. In the case that the top electrode layer 703 is a metal electrode, it may be formed, for example, by titanium nitride (TiN). The top electrode layer 703 may constitute capacitors with the capacitor dielectric layer 702 and the bottom electrode layer 701 either inside or outside the corresponding cylindrical structures. In addition, since the presence of lateral supporting layers (i.e. the middle supporting layer 601 and the top supporting layer 602) on the edge region of core region I (i.e. the border region of an array of the capacitor holes), the capacitor dielectric layer 702 and the top electrode layer 703 are provided with uneven sidewall structures. The uneven sidewall structure corresponds to the middle supporting layer 601 and the top supporting layer 602 outside the cylindrical structures of bottom electrode layer 701, thus the portion of top electrode layer 703 on the edge region of core region I (i.e. the border region of the array of capacitor holes) corresponding to the middle supporting layer 601 and the top supporting layer 602 would protrude away from the bottom electrode layer 701 to form an uneven border of the capacitor array in the core region I. In addition, in the embodiment, the capacitor dielectric layer 702 and the top electrode layer 703 further extend sequentially to cover on the surface of bottom supporting layer 600 remaining on the peripheral region II.

Please refer to FIG. 24 or FIG. 25. A top electrode filling layer 704 may be formed firstly on the surface of top electrode layer 703 through a CVD process to fill up the gaps between the top electrode layers 703. That is, the top electrode filling layer 704 fills up the gaps between adjacent cylindrical structures and cover the structures formed in the aforementioned process. Preferably, the material of top electrode filling layer 704 includes undoped polysilicon and boron-doped polysilicon. Accordingly, the manufacture of capacitor array is completed.

It may be understood that, since the top surface of first edge contact pad and second edge contact pad 511*b* have larger area, it may provide sufficient process window to the manufacture of the capacitors 705*b* and provide the capacitor holes corresponding to the capacitors 705*b* with larger width, thereby avoiding the deformation and collapse of the capacitor holes corresponding to the capacitors 705*b*. At the same time, it also provides larger contact area between the capacitor 705*b* and corresponding first edge contact pad or second edge contact pad 511*b* to decrease contact resistance and improve the electrical performance of devices. In addition, since the contact hole corresponding to the capacitor 705*b* has larger width, the density difference of circuit patterns between the core region I and the peripheral region II may be buffered to improve optical proximity effect when performing photolithography processes and/or etching process and to mitigate the dense/isolated loading effect of circuit patterns in the peripheral region II and the core region I. It also ensures the uniformity of contact holes inside the boundary of the core region or capacitors filled in the contact holes in the core region, to prevent the anomaly of contact holes on the primary contact plugs in the core region and capacitor failure caused later by this anomaly.

It should be noted that the embodiments in the specification are described in a progressive manner, wherein each embodiment is emphasized in features different from the one of other embodiments, and identical or similar features between the embodiments may be referred to each other. Furthermore, the description above is merely a description for the preferred embodiment of present invention, rather than to limit the scope of present invention. Those skilled in the art will readily observe that numerous modifications and alterations of the device and method may be made while retaining the teachings of the invention. Accordingly, the above disclosure should be construed as limited only by the metes and bounds of the appended claims.

In addition, it should also be noted that, unless specified or pointed out, the terms "first", "second" and "third" in the specification are used merely to distinguish components, elements, steps, etc., in the specification, rather than to indicate the logical relation or sequential relation between the components, elements and steps.

What is claimed is:

1. A semiconductor device, comprising:
   multiple core components comprising active areas; and
   multiple contact plugs in the semiconductor device, wherein the contact plugs comprises first contact plugs and at least one second contact plug, and the at least one second contact plug is in a shape of inverted-U or comb, and a bottom of each of the contact plugs contacts the active area;
   a plurality of first capacitors directly contact on the first contact plugs; and
   a second capacitor directly contact on the at least one second contact plug;
   wherein a topmost surface of the at least one second contact plug is not lower than a topmost surface of the first contact plug.

2. The semiconductor device of claim 1, further comprising:
   multiple word lines, each of the word lines intersects the active areas;
   multiple bit lines, wherein an extending direction of the bit lines is perpendicular to an extending direction of the word lines; and
   the at least one second contact plug crossing over at least one of the word lines and aligning with the bit lines.

3. The semiconductor device of claim 1, further comprising an individual contact pads formed on the top of each of the first contact plug and respectively and electrically contacting the corresponding contact plug.

4. The semiconductor device of claim 1, wherein the at least one second contact plug is an integrated structure, or at least two of the contact plugs are connected together through a contact pad connected above.

5. The semiconductor device of claim 1, wherein the second capacitor has a first width, the first capacitor has a second width, and the first width is larger than the second width.

6. The semiconductor device of claim 5, wherein the first width is larger than a half of the second width.

\* \* \* \* \*